US010199159B2

(12) United States Patent
Nakajima et al.

(10) Patent No.: US 10,199,159 B2
(45) Date of Patent: Feb. 5, 2019

(54) INSULATION TYPE STEP-DOWN COVERTER

(71) Applicant: MITSUBISHI ELECTRIC CORPORATION, Chiyoda-ku, Tokyo (JP)

(72) Inventors: Koji Nakajima, Tokyo (JP); Takashi Kumagai, Tokyo (JP); Yuji Shirakata, Tokyo (JP); Yujiro Kido, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 49 days.

(21) Appl. No.: 15/535,811

(22) PCT Filed: Nov. 25, 2015

(86) PCT No.: PCT/JP2015/082998
§ 371 (c)(1),
(2) Date: Jun. 14, 2017

(87) PCT Pub. No.: WO2016/098538
PCT Pub. Date: Jun. 23, 2016

(65) Prior Publication Data
US 2018/0350514 A1    Dec. 6, 2018

(30) Foreign Application Priority Data
Dec. 16, 2014   (JP) ................. 2014-254056

(51) Int. Cl.
*H02M 7/155* (2006.01)
*H01F 27/38* (2006.01)
(Continued)

(52) U.S. Cl.
CPC ......... *H01F 27/38* (2013.01); *H01F 27/2804* (2013.01); *H01F 27/2876* (2013.01);
(Continued)

(58) Field of Classification Search
CPC ...................... H02M 3/33584; H02M 3/33507
(Continued)

(56) References Cited

U.S. PATENT DOCUMENTS

| 4,825,348 | A | * | 4/1989 | Steigerwald | ............ | H02M 3/28 |
| | | | | | | 363/132 |
| 4,858,093 | A | * | 8/1989 | Sturgeon | ................. | H02M 3/28 |
| | | | | | | 363/20 |

(Continued)

FOREIGN PATENT DOCUMENTS

| JP | 2004-303857 A | 10/2004 |
| JP | 2008-178205 A | 7/2008 |

(Continued)

OTHER PUBLICATIONS

International Search Report (PCT/ISA/210) dated Feb. 23, 2016, by the Japanese Patent Office as the International Searching Authority for International Application No. PCT/JP2015/082998.

*Primary Examiner* — Adolf Berhane
*Assistant Examiner* — Nusrat Quddus
(74) *Attorney, Agent, or Firm* — Buchanan Ingersoll & Rooney PC

(57) ABSTRACT

An insulation type step-down converter includes first and second step-down transformers each of which includes an input-side coil and an output-side coil. First, second, third, and fourth rectifier elements are connected in series with first, second, third, and fourth series coils, respectively, the first, second, third, and fourth series coils each having the output-side coil of the first step-down transformer and the output-side coil of the second step-down transformer connected in series. The first to fourth series coils are connected to smoothing coils. The connection is such that electric currents flow simultaneously only in one of the first and second series coils and one of the third and fourth series coils in an alternate manner, and electric currents flowing (Continued)

simultaneously in one of the first and second series coils and one of the third and fourth series coils are opposite in direction to each other.

9 Claims, 26 Drawing Sheets

(51) Int. Cl.
    *H02M 3/335*     (2006.01)
    *H02M 7/00*     (2006.01)
    *H05K 1/02*     (2006.01)
    *H05K 1/11*     (2006.01)
    *H01F 27/28*     (2006.01)
    *H01F 27/42*     (2006.01)
    *H01F 27/40*     (2006.01)

(52) U.S. Cl.
    CPC ............ *H01F 27/40* (2013.01); *H01F 27/42* (2013.01); *H02M 3/33507* (2013.01); *H02M 7/003* (2013.01); *H05K 1/0298* (2013.01); *H05K 1/115* (2013.01); *H01F 2027/2809* (2013.01); *H01F 2027/2819* (2013.01); *H01F 2027/408* (2013.01)

(58) Field of Classification Search
    USPC .................. 363/15–17, 44–53, 123, 125–127
    See application file for complete search history.

(56) References Cited

U.S. PATENT DOCUMENTS

| | | | | |
|---|---|---|---|---|
| 4,864,479 | A | * | 9/1989 | Steigerwald ............ H02M 1/38 363/17 |
| 5,132,888 | A | * | 7/1992 | Lo .......................... H02M 3/337 363/132 |
| 5,555,494 | A | | 9/1996 | Morris |
| 5,975,830 | A | * | 11/1999 | Goodrich .................. B60P 1/02 414/541 |
| 9,231,433 | B2 | * | 1/2016 | Schillinger ............. H02J 7/022 |
| 2008/0247195 | A1 | | 10/2008 | Nakahori |
| 2009/0237044 | A1 | * | 9/2009 | Gjini .................. H02M 3/1582 323/239 |
| 2018/0234008 | A1 | * | 8/2018 | Wolf ....................... H01F 37/00 |

FOREIGN PATENT DOCUMENTS

| | | |
|---|---|---|
| JP | 2008-259387 A | 10/2008 |
| JP | 2011-77328 A | 4/2011 |
| JP | 2013-198387 A | 9/2013 |

* cited by examiner

INSULATION TYPE STEP-DOWN COVERTER

TECHNICAL FIELD

The present invention relates to an insulation type step-down converter, and more particularly to an insulation type step-down converter which produces a DC low voltage from a DC high voltage.

BACKGROUND ART

In Japanese Patent Laying-Open No. 2008-178205 (PTD 1), for example, a step-down transformer is divided into two parts, where two input-side coils are connected in series as an input-side circuit and two smoothing coils are connected in parallel as an output-side circuit.

CITATION LIST

Patent Document

PTD 1: Japanese Patent Laying-Open No. 2008-178205

SUMMARY OF INVENTION

Technical Problem

In Japanese Patent Laying-Open No. 2008-178205, a smoothing coil is divided into two parts to distribute electric current, which allows for reduction and distribution of the amount of generated heat. In Japanese Patent Laying-Open No. 2008-178205, however, due to unbalance between voltages applied to the respective input-side coils of the two step-down transformers, and coupling unbalance between the input-side coils and the output-side coils of the step-down transformers, electric currents flowing in the two smoothing coils may not become equal, resulting in unbalance between the values of these electric currents. It is thus required to leave a margin corresponding to the unbalance. As used herein, leaving a margin means designing a large current-carrying cross section of windings of smoothing coils, from the viewpoint of suppressing excessive temperature increase in one of two smoothing coils resulting from larger electric current flowing in the one of the smoothing coils than the other smoothing coil. However, this may increase the size of the smoothing coils, which runs counter to the trend toward higher integration of semiconductor devices.

The present invention was made in view of the above-described problem, and has an object to provide an insulation type step-down converter in which electric currents flowing in two divided smoothing coils can be made equal in value, to reduce the size of the smoothing coils.

Solution to Problem

An insulation type step-down converter of the present invention includes first and second step-down transformers each of which includes an input-side coil and an output-side coil. First, second, third, and fourth rectifier elements are connected in series with first, second, third, and fourth series coils, respectively, the first, second, third, and fourth series coils each having the output-side coil of the first step-down transformer and the output-side coil of the second step-down transformer connected in series. The first to fourth series coils are connected to smoothing coils. The connection is such that electric currents flow simultaneously only in one of the first and second series coils and one of the third and fourth series coils in an alternate manner, and electric currents flowing simultaneously in one of the first and second series coils and one of the third and fourth series coils are opposite in direction to each other.

Advantageous Effects of Invention

According to the present invention, since the electric currents flowing in the two smoothing coils can be made equal in value, the size of the smoothing coils can be reduced.

BRIEF DESCRIPTION OF DRAWINGS

FIG. 4 shows a schematic diagram (A) showing a pattern of the lowermost layer of input-side and output-side coils constituting a step-down transformer in a first example of the first embodiment shown in the circuit block diagram of FIG. 1, and a direction of a magnetic flux when an input-side drive circuit is in a first state, a schematic diagram (B) showing a pattern of the second lowermost layer of the input-side and output-side coils in the first example of the first embodiment and the like, a schematic diagram (C) showing a pattern of the third lowermost layer of the input-side and output-side coils in the first example of the first embodiment and the like, and a schematic diagram (D) showing a pattern of the fourth lowermost layer of the input-side and output-side coils in the first example of the first embodiment and the like.

FIG. 5 shows a schematic diagram (A) showing a pattern of the lowermost layer of the input-side and output-side coils constituting the step-down transformer in the first example of the first embodiment shown in the circuit block diagram of FIG. 1, and a direction of a magnetic flux when the input-side drive circuit is in a second state, a schematic diagram (B) showing a pattern of the second lowermost layer of the input-side and output-side coils in the first example of the first embodiment and the like, a schematic diagram (C) showing a pattern of the third lowermost layer of the input-side and output-side coils in the first example of the first embodiment and the like, and a schematic diagram (D) showing a pattern of the fourth lowermost layer of the input-side and output-side coils in the first example of the first embodiment and the like.

FIG. 6 shows a schematic diagram (A) showing a pattern of the lowermost layer of input-side and output-side coils constituting a step-down transformer in a second example of the first embodiment shown in the circuit block diagram of FIG. 1, and a direction of a magnetic flux when an input-side drive circuit is in a first state, a schematic diagram (B) showing a pattern of the second lowermost layer of the input-side and output-side coils in the second example of the first embodiment and the like, a schematic diagram (C) showing a pattern of the third lowermost layer of the input-side and output-side coils in the second example of the first embodiment and the like, and a schematic diagram (D) showing a pattern of the fourth lowermost layer of the input-side and output-side coils in the second example of the first embodiment and the like.

FIG. 7 shows a schematic diagram (A) showing a pattern of the lowermost layer of the input-side and output-side coils constituting the step-down transformer in the second example of the first embodiment shown in the circuit block diagram of FIG. 1, and a direction of a magnetic flux when the input-side drive circuit is in a second state, a schematic diagram (B) showing a pattern of the second lowermost layer of the input-side and output-side coils in the second example of the first embodiment and the like, a schematic diagram (C) showing a pattern of the third lowermost layer of the input-side and output-side coils in the second example of the first embodiment and the like, and a schematic diagram (D) showing a pattern of the fourth lowermost layer of the input-side and output-side coils in the second example of the first embodiment and the like.

FIG. 8 shows a schematic diagram (A) showing a pattern of the lowermost layer of input-side and output-side coils constituting a step-down transformer in a third example of the first embodiment shown in the circuit block diagram of FIG. 1, and a direction of a magnetic flux when an input-side drive circuit is in a first state, a schematic diagram (B) showing a pattern of the second lowermost layer of the input-side and output-side coils in the third example of the first embodiment and the like, a schematic diagram (C) showing a pattern of the third lowermost layer of the input-side and output-side coils in the third example of the first embodiment and the like, and a schematic diagram (D) showing a pattern of the fourth lowermost layer of the input-side and output-side coils in the third example of the first embodiment and the like.

FIG. 12 shows a schematic diagram (A) showing a pattern of the lowermost layer of input-side and output-side coils constituting a step-down transformer in a first example of the second embodiment shown in the circuit block diagram of FIG. 11, and a direction of a magnetic flux when an input-side drive circuit is in a first state, a schematic diagram (B) showing a pattern of the second lowermost layer of the input-side and output-side coils in the first example of the second embodiment and the like, a schematic diagram (C) showing a pattern of the third lowermost layer of the input-side and output-side coils in the first example of the second embodiment and the like, and a schematic diagram (D) showing a pattern of the fourth lowermost layer of the input-side and output-side coils in the first example of the second embodiment and the like.

FIG. 13 shows a schematic diagram (A) showing a pattern of the lowermost layer of the input-side and output-side coils constituting the step-down transformer in the first example of the second embodiment shown in the circuit block diagram of FIG. 11, and a direction of a magnetic flux when the input-side drive circuit is in a second state, a schematic diagram (B) showing a pattern of the second lowermost layer of the input-side and output-side coils in the first example of the second embodiment and the like, a schematic diagram (C) showing a pattern of the third lowermost layer of the input-side and output-side coils in the first example of the second embodiment and the like, and a schematic diagram (D) showing a pattern of the fourth lowermost layer of the input-side and output-side coils in the first example of the second embodiment and the like.

FIG. 14 shows a schematic diagram (A) showing a pattern of the lowermost layer of input-side and output-side coils constituting a step-down transformer in a second example of the second embodiment shown in the circuit block diagram of FIG. 11, and a direction of a magnetic flux when an input-side drive circuit is in a first state, a schematic diagram (B) showing a pattern of the second lowermost layer of the input-side and output-side coils in the second example of the second embodiment and the like, a schematic diagram (C) showing a pattern of the third lowermost layer of the input-side and output-side coils in the second example of the second embodiment and the like, and a schematic diagram (D) showing a pattern of the fourth lowermost layer of the input-side and output-side coils in the second example of the second embodiment and the like.

FIG. 15 shows a schematic diagram (A) showing a pattern of the lowermost layer of the input-side and output-side coils constituting the step-down transformer in the second example of the second embodiment shown in the circuit block diagram of FIG. 11, and a direction of a magnetic flux when the input-side drive circuit is in a second state, a schematic diagram (B) showing a pattern of the second lowermost layer of the input-side and output-side coils in the second example of the second embodiment and the like, a schematic diagram (C) showing a pattern of the third lowermost layer of the input-side and output-side coils in the second example of the second embodiment and the like, and a schematic diagram (D) showing a pattern of the fourth lowermost layer of the input-side and output-side coils in the second example of the second embodiment and the like.

FIG. 17 shows a schematic diagram (A) showing a pattern of the lowermost layer of input-side and output-side coils constituting a step-down transformer in a first example of the third embodiment shown in the circuit block diagram of FIG. 16, and a direction of a magnetic flux when an input-side drive circuit is in the first state, a schematic diagram (B) showing a pattern of the second lowermost layer of the input-side and output-side coils in the first example of the third embodiment and the like, a schematic diagram (C) showing a pattern of the third lowermost layer of the input-side and output-side coils in the first example of the third embodiment and the like, and a schematic diagram (D) showing a pattern of the fourth lowermost layer of the input-side and output-side coils in the first example of the third embodiment and the like.

FIG. 18 shows a schematic diagram (A) showing a pattern of the lowermost layer of the input-side and output-side coils constituting the step-down transformer in the first example of the third embodiment shown in the circuit block diagram of FIG. 16, and a direction of a magnetic flux when the input-side drive circuit is in a second state, a schematic diagram (B) showing a pattern of the second lowermost layer of the input-side and output-side coils in the first example of the third embodiment and the like, a schematic diagram (C) showing a pattern of the third lowermost layer of the input-side and output-side coils in the first example of the third embodiment and the like, and a schematic diagram (D) showing a pattern of the fourth lowermost layer of the input-side and output-side coils in the first example of the third embodiment and the like.

FIG. 19 shows a schematic diagram (A) showing a pattern of the lowermost layer of input-side and output-side coils constituting a step-down transformer in a second example of the third embodiment shown in the circuit block diagram of FIG. 16, and a direction of a magnetic flux when an input-side drive circuit is in a first state, a schematic diagram (B) showing a pattern of the second lowermost layer of the input-side and output-side coils in the second example of the third embodiment and the like, a schematic diagram (C) showing a pattern of the third lowermost layer of the input-side and output-side coils in the second example of the third embodiment and the like, and a schematic diagram (D) showing a pattern of the fourth lowermost layer of the input-side and output-side coils in the second example of the third embodiment and the like.

FIG. 20 shows a schematic diagram (A) showing a pattern of the lowermost layer of the input-side and output-side coils constituting the step-down transformer in the second example of the third embodiment shown in the circuit block diagram of FIG. 16, and a direction of a magnetic flux when the input-side drive circuit is in a second state, a schematic diagram (B) showing a pattern of the second lowermost layer of the input-side and output-side coils in the second example of the third embodiment and the like, a schematic diagram (C) showing a pattern of the third lowermost layer of the input-side and output-side coils in the second example of the third embodiment and the like, and a schematic diagram (D) showing a pattern of the fourth lowermost layer of the input-side and output-side coils in the second example of the third embodiment and the like.

FIG. 23 shows a schematic diagram (A) showing a pattern of the lowermost layer of input-side and output-side coils constituting the step-down transformer of the fourth embodiment shown in the circuit block diagram of FIG. 21, and a direction of a magnetic flux when an input-side drive circuit is in a first state, a schematic diagram (B) showing a pattern of the second lowermost layer of the input-side and output-side coils of the fourth embodiment and the like, a schematic diagram (C) showing a pattern of the third lowermost layer of the input-side and output-side coils of the fourth embodiment and the like, and a schematic diagram (D) showing a pattern of the fourth lowermost layer of the input-side and output-side coils of the fourth embodiment and the like.

FIG. 24 shows a schematic diagram (A) showing a pattern of the lowermost layer of the input-side and output-side coils constituting the step-down transformer of the fourth embodiment shown in the circuit block diagram of FIG. 21, and a direction of a magnetic flux when the input-side drive circuit is in a second state, a schematic diagram (B) showing a pattern of the second lowermost layer of the input-side and output-side coils of the fourth embodiment and the like, a schematic diagram (C) showing a pattern of the third lowermost layer of the input-side and output-side coils of the fourth embodiment and the like, and a schematic diagram (D) showing a pattern of the fourth lowermost layer of the input-side and output-side coils of the fourth embodiment and the like.

FIG. 27 shows a schematic diagram (A) showing a pattern of the lowermost layer of input-side and output-side coils constituting the step-down transformer of the fifth embodiment shown in the circuit block diagram of FIG. 26, and a direction of a magnetic flux when an input-side drive circuit is in a first state, a schematic diagram (B) showing a pattern of the second lowermost layer of the input-side and output-side coils of the fifth embodiment and the like, a schematic diagram (C) showing a pattern of the third lowermost layer of the input-side and output-side coils of the fifth embodiment and the like, and a schematic diagram (D) showing a pattern of the fourth lowermost layer of the input-side and output-side coils of the fifth embodiment and the like.

FIG. 28 shows a schematic diagram (A) showing a pattern of the lowermost layer of the input-side and output-side coils constituting the step-down transformer of the fifth embodiment shown in the circuit block diagram of FIG. 26, and a direction of a magnetic flux when the input-side drive circuit is in a second state, a schematic diagram (B) showing a pattern of the second lowermost layer of the input-side and output-side coils of the fifth embodiment and the like, a schematic diagram (C) showing a pattern of the third lowermost layer of the input-side and output-side coils of the fifth embodiment and the like, and a schematic diagram (D) showing a pattern of the fourth lowermost layer of the input-side and output-side coils of the fifth embodiment and the like.

DESCRIPTION OF EMBODIMENTS

Hereinafter, embodiments of the present invention will be described based on the drawings.

First Embodiment

First, a circuit constituting an insulation type step-down converter of the present embodiment will be described using FIG. 1.

Figure 1:
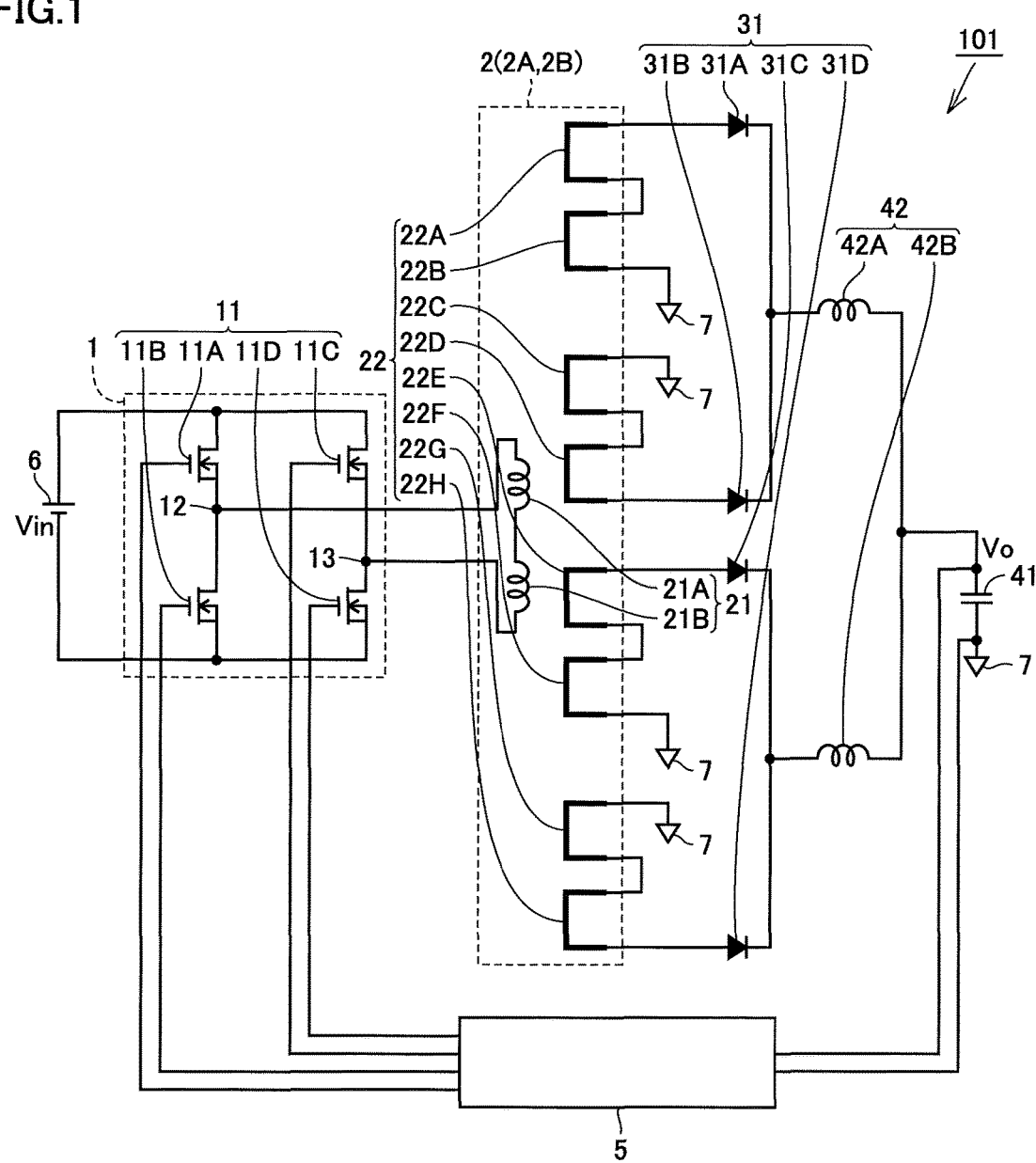
FIG. 1 is a circuit block diagram of an insulation type step-down converter of a first embodiment.

Referring to FIG. 1, an insulation type step-down converter 101 of the present embodiment mainly has an input-side drive circuit 1, a step-down transformer 2, a rectifier element 31, a smoothing coil 42, and a control circuit 5.

Input-side drive circuit 1 has four switching elements 11A, 11B, 11C, and 11D (which will be collectively called a switching element 11). Step-down transformer 2 has a step-down transformer 2A (first step-down transformer) and a step-down transformer 2B (second step-down transformer). Rectifier element 31 has four rectifier elements 31A, 31B, 31C, and 31D. Smoothing coil 42 has a smoothing coil 42A (first smoothing coil) and a smoothing coil 42B (second smoothing coil).

In input-side drive circuit 1, switching element 11 is connected as shown in FIG. 1. Specifically, switching elements 11A and 11B connected in series and switching elements 11C and 11D connected in series are connected in parallel. A node 12 exists between switching elements 11A and 11B, and a node 13 exists between switching elements 11C and 11D. An input-side coil 21A (first input-side coil) and an input-side coil 21B (second input-side coil) connected in series with each other and serving as an input-side coil 21 are connected across nodes 12 and 13.

Since switching element 11 is connected to control circuit 5, switching elements 11A to 11D are controlled by control circuit 5 so as to be alternately turned on and off. Specifically, a first state in which switching elements 11A and 11D are turned on and a second state in which switching elements 11B and 11C are turned on are brought about alternately at regular time intervals. Accordingly, in input-side drive circuit 1, an input voltage from a voltage Vin of a DC power supply 6 is applied to input-side coils 21A and 21B in opposite directions to each other in the first and second states (so as to be a positive voltage in one state and a negative voltage in the other state).

As described above, switching element 11 constitutes a so-called full bridge circuit by four switching elements 11A to 11D. However, the mode of switching element 11 is not limited to that shown in FIG. 1 as long as a voltage can be applied alternately to input-side coil 21 in opposite directions to each other in the first and second states, and a so-called half bridge circuit implemented by two switching elements, for example, may be adopted.

Step-down transformers 2A and 2B have eight output-side coils 22A, 22B, 22C, 22D, 22E, 22F, 22G, and 22H as an output-side coil 22. Output-side coils 22A and 22B are connected in series. One end (end on the side of output-side coil 22B) of a pair of ends of output-side coils 22A and 22B connected in series is connected to a reference potential 7 on the output side of insulation type step-down converter 101, and the other end (end on the side of output-side coil 22A) is connected to the anode of rectifier element 31A.

Similarly, output-side coils 22C and 22D are connected in series. One end (end on the side of output-side coil 22C) of a pair of ends of output-side coils 22C and 22D connected in series is connected to reference potential 7 on the output side of insulation type step-down converter 101, and the other end (end on the side of output-side coil 22D) is connected to the anode of rectifier element 31B. Output-side coils 22E and 22F are connected in series. One end (end on the side of output-side coil 22F) of a pair of ends of output-side coils 22E and 22F connected in series is connected to reference potential 7 on the output side of insulation type step-down converter 101, and the other end (end on the side of output-side coil 22E) is connected to the anode of rectifier element 31C. Output-side coils 22G and 22H are connected in series. One end (end on the side of output-side coil 22G) of a pair of ends of output-side coils 22G and 22H connected in series is connected to reference potential 7 on the output side of insulation type step-down converter 101, and the other end (end on the side of output-side coil 22H) is connected to the anode of rectifier element 31C.

The cathode of each of rectifier elements 31A and 31B is connected to smoothing coil 42A, and the cathode of each of rectifier elements 31C and 31D is connected to smoothing coil 42B. An end of a pair of ends of each of smoothing coils 42A and 42B opposite to the end connected to rectifier elements 31A to 31D is connected to a smoothing capacitor 41. An output voltage Vo of insulation type step-down converter 101 is applied between both ends of smoothing capacitor 41.

One of output-side coils 22A and 22B connected in series constitutes step-down transformer 2A, and the other one constitutes step-down transformer 2B. Similarly, one of output-side coils 22C and 22D connected in series constitutes step-down transformer 2A, and the other one constitutes step-down transformer 2B. One of output-side coils 22E and 22F connected in series constitutes step-down transformer 2A, and the other one constitutes step-down transformer 2B. One of output-side coils 22G and 22H connected in series constitutes step-down transformer 2A, and the other one constitutes step-down transformer 2B.

Next, the structure of each component constituting step-down transformer 2 in the present embodiment will be described using FIGS. 2 to 8.

Figure 2:
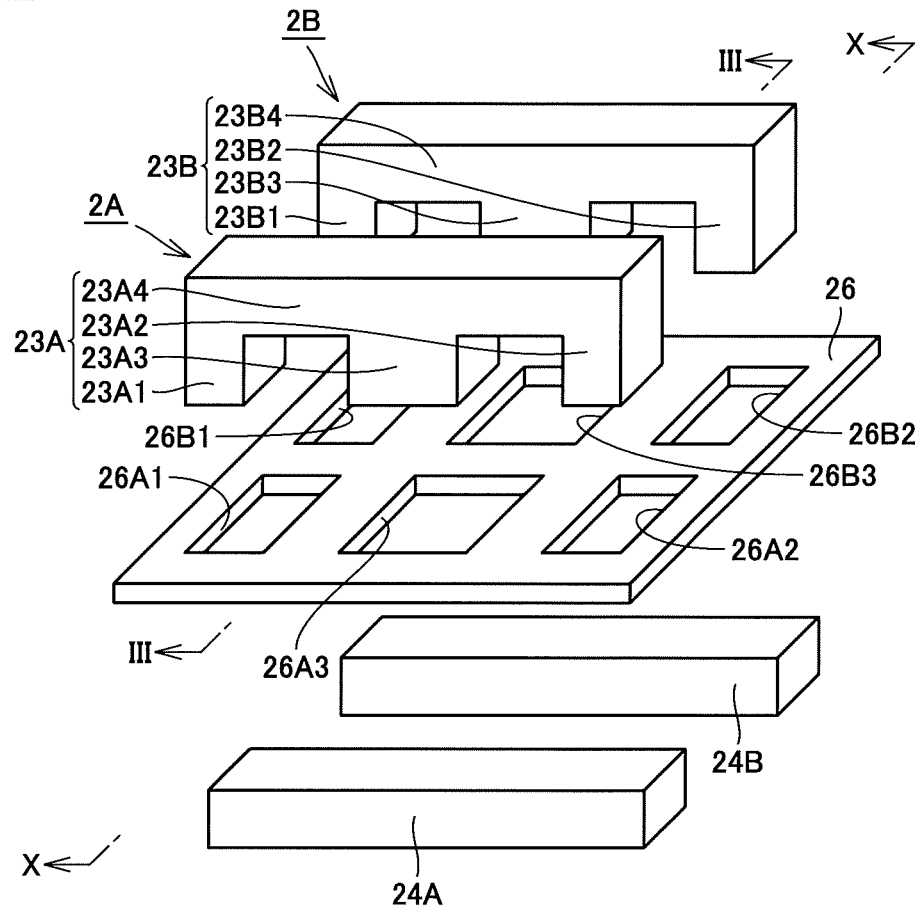
FIG. 2 is an exploded perspective view showing arrangement of cores and a multilayer printed board constituting a step-down transformer of the first embodiment.

Referring to FIG. 2, step-down transformer 2 of the present embodiment mainly has, as step-down transformer 2A, an E-shaped core 23A (first core), an I-shaped core 24A, and a multilayer printed board 26. Step-down transformer 2 has, as step-down transformer 2B, an E-shaped core 23B (second core), an I-shaped core 24B, and multilayer printed board 26. Step-down transformers 2A and 2B are arranged to be aligned with each other (in the horizontal direction, for example). Step-down transformers 2A and 2B share multilayer printed board 26.

E-shaped core 23A has outer legs 23A1, 23A2, a middle leg 23A3, and a core coupling part 23A4 shown in FIG. 2. Outer legs 23A1, 23A2 and middle leg 23A3 extend downward in FIG. 2 from core coupling part 23A4, and core coupling part 23A4 is a region extending in the horizontal direction in FIG. 2. E-shaped core 23B has outer legs 23B1, 23B2, a middle leg 23B3, and a core coupling part 23B4 shown in FIG. 2. Outer legs 23B1, 23B2 and middle leg 23B3 extend downward in FIG. 2 from core coupling part 23B4, and core coupling part 23B4 is a region extending in the horizontal direction in FIG. 2. It is noted that since FIG. 2 is an exploded perspective view merely showing arrangement of the above-described respective components, not a mode in which these respective components have been assembled in step-down transformer 2 finally.

Outer leg 23A1 (first one outer leg) of E-shaped core 23A extends in the same direction as middle leg 23A3 (first middle leg), that is, downward in FIG. 2, and is spaced from middle leg 23A3 (in the horizontal direction in FIG. 2). Outer leg 23A2 (first other outer leg) is spaced from middle leg 23A3 (in the horizontal direction in FIG. 2) opposite to outer leg 23A1 with respect to middle leg 23A3 (i.e., on the right side of middle leg 23A3 in FIG. 2). That is, two outer legs 23A1 and 23A2 in E-shaped core 23A are arranged to sandwich middle leg 23A3 from the right and left sides in FIG. 2. Core coupling part 23A4 is a portion extending in the direction (horizontal direction in FIG. 2) crossing the direction in which outer legs 23A1, 23A2 and middle leg 23A3 extend such that outer legs 23A1, 23A2 and middle leg 23A3 extending in the vertical direction in FIG. 2 are connected to each other at their upper ends.

Similarly, outer leg 23B1 (second one outer leg) of E-shaped core 23B extends in the same direction as middle leg 23B3 (second middle leg), that is, downward in FIG. 2, and is spaced from middle leg 23B3 (in the horizontal direction in FIG. 2). Outer leg 23B2 (second other outer leg) is spaced from middle leg 23B3 (in the horizontal direction in FIG. 2) opposite to outer leg 23B1 with respect to middle leg 23B3 (i.e., on the right side of middle leg 23B3 in FIG. 2). That is, two outer legs 23B1 and 23B2 in E-shaped core 23B are arranged to sandwich middle leg 23B3 from the right and left sides in FIG. 2. Core coupling part 23B4 is a portion extending in the direction (horizontal direction in FIG. 2) crossing the direction in which outer legs 23B1, 23B2 and middle leg 23B3 extend such that outer legs 23B1, 23B2 and middle leg 23B3 extending in the vertical direction in FIG. 2 are connected to each other at their upper ends.

In FIG. 2, the cross section crossing the direction in which middle legs 23A3 and 23B3 extend is larger than the cross section crossing the direction in which outer legs 23A1, 23A2, 23B1, and 23B2 extend. More specifically, the cross sections of outer legs 23A1, 23B1 and outer legs 23A2, 23B2 in FIG. 2 are almost equal in area, and the sum of the areas of the cross sections of two outer legs 23A1 and 23A2 (the sum of the areas of the cross sections of outer legs 23B1 and 23B2) is almost equal to the area of the cross section of middle leg 23A3 (middle leg 23B3). However, this mode is not a limitation.

E-shaped cores 23A and 23B each have a shape just like the character of "E" when seen from the front side in FIG. 2.

I-shaped cores 24A and 24B each have a rectangular parallelepiped shape extending in the horizontal direction in the drawing similarly to core coupling parts 23A4 and 23B4. Preferably, E-shaped core 23A and I-shaped core 24A, and E-shaped core 23B and I-shaped core 24B each have a rectangular shape (long shape) in a congruence relationship with each other when FIG. 2 as a whole is seen from above (seen in plan view). By mounting E-shaped cores 23A and 23B on the surfaces of I-shaped cores 24A and 24B so as to come into contact with the surfaces, E-shaped cores 23A, 23B and I-shaped cores 24A, 24B serve as a set constituting step-down transformers 2A and 2B.

It is noted that both E-shaped cores 23A, 23B and I-shaped cores 24A, 24B are preferably made of generally-known ferrite or the like.

Multilayer printed board 26 is a flat plate-like component having a rectangular shape in plan view, for example. Multilayer printed board 26 has six through-holes 26A1, 26A2, 26A3, 26B1, 26B2, and 26B3, for example, spaced from each other and formed in a matrix in a manner to extend through multilayer printed board 26 from one main surface (the upper side in the drawing) to the other main surface (the lower side in the drawing).

Multilayer printed board 26 arranged to be sandwiched between E-shaped core 23A and I-shaped core 24A is set such that outer leg 23A1 is inserted through through-hole 26A1, outer leg 23A2 is inserted through through-hole 26A2, and middle leg 23A3 is inserted through through-hole 26A3. Outer and middle legs 23A1, 23A2, and 23A3 are fixed such that their terminal ends (on the lowermost part in FIG. 2) are mounted on the surface of the long shape of I-shaped core 24. Step-down transformer 2A is thereby assembled such that outer legs 23A1, 23A2 and part of middle leg 23A3 of E-shaped core 23A are inserted through through-holes 26A1, 26A2, and 26A3, respectively. Similarly, multilayer printed board 26 is set such that outer leg 23B1 is inserted through through-hole 26B1, outer leg 23B2 is inserted through through-hole 26B2, and middle leg 23B3 is inserted through through-hole 26B3. Assembled step-down transformer 2A has two magnetic paths, one formed by outer leg 23A1 and middle leg 23A3, the other formed by outer leg 23A2 and middle leg 23A3. The same applies to step-down transformer 2B.

It is noted that two magnetic paths are formed here by combining an E-shaped core and an I-shaped core, but this is not a limitation. A step-down transformer having two magnetic paths may be assembled by combining two E-shaped cores or combining two EER type cores, for example.

Figure 3:
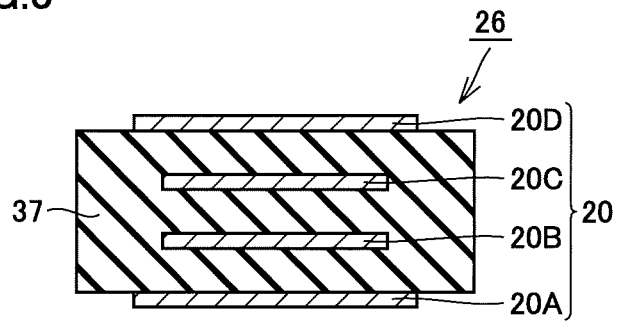
FIG. 3 is a schematic sectional view showing the configuration of the multilayer printed board at a portion taken along the line III-III in FIG. 2, after final assembly.

Referring to FIGS. 2 and 3, multilayer printed board 26 after final assembly is a substrate formed by using a substrate body 37 of an insulating material, such as generally-known resin, for example, as a base and a pattern 20 of a plurality of metallic thin films of copper or the like, for example, formed therein as traces. Multilayer printed board 26 of the present embodiment has a four-layer pattern of patterns 20A, 20B, 20C, and 20D, for example. Among them, pattern 20A of the lowermost layer may be formed so as to come into contact with the lowermost surface of substrate body 37 (i.e., so as to be the lowermost layer of multilayer printed board 26 as a whole). Pattern 20D of the uppermost layer may be formed so as to come into contact with the uppermost surface of substrate body 37 (i.e., so as to be the uppermost layer of multilayer printed board 26 as a whole). However, this mode is not a limitation, but patterns 20A and 20D, for example, may be formed within multilayer printed board 26 (similarly to patterns 20B and 20C). Patterns 20A to 20D are in the mode in which they are spaced from each other in the vertical direction in FIG. 3 by substrate body 37 made of an insulating material and are not electrically connected (not short-circuited) to each other unless they are connected by wiring vias or the like, for example.

Multilayer printed board 26 having four-layer patterns 20A to 20D as shown in FIG. 3 may also be called a four-layer printed circuit board. By arranging four-layer patterns 20A to 20D around through-holes 26A1 to 26A3 and the like, through-holes 26A1 to 26A3 and the like are surrounded by patterns 20A to 20D.

Next, the configuration of the pattern, that is, the input-side and output-side coils, of each layer, and the operation of the step-down transformer will be described using FIGS. 4 to 8.

Figure 4:
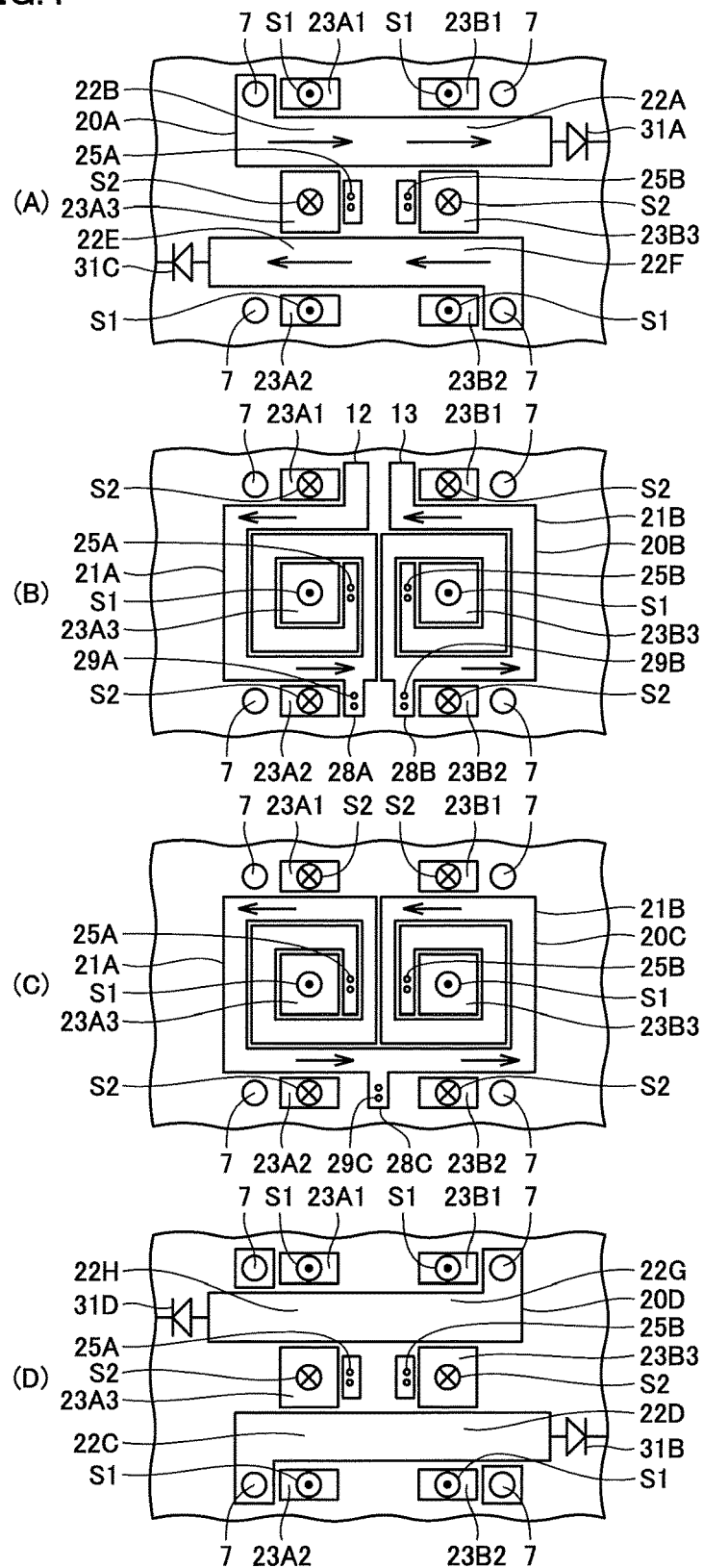

Referring to FIG. 4 (A), in a first example of the present embodiment, when the first layer which is the lowermost layer of four-layer patterns 20A to 20D of multilayer printed board 26 is seen in plan view, four output-side coils 22A, 22B, 22E, and 22F are arranged on this plane as the same layer (on the same plane) as pattern 20A of FIG. 3. That is, above-described output-side coils 22A, 22B, 22E, and 22F may be considered as the same layer as pattern 20A (a film corresponding to pattern 20A), and are coils formed as a copper thin film pattern, for example.

Output-side coil 22A (fifth output-side coil) is arranged to include a region between outer leg 23B1 and middle leg 23B3 of step-down transformer 2B, and output-side coil 22B (first output-side coil) connected in series with output-side coil 22A is arranged to include a region between outer leg 23A1 and middle leg 23A3 of step-down transformer 2A. Output-side coil 22E (fourth output-side coil) is arranged to include a region between outer leg 23A2 and middle leg 23A3 of step-down transformer 2A, and output-side coil 22F (eighth output-side coil) connected in series with output-side coil 22E is arranged to include a region between outer leg 23B2 and middle leg 23B3 of step-down transformer 2B.

Accordingly, output-side coils 22B and 22E constitute step-down transformer 2A, and output-side coils 22A and 22F constitute step-down transformer 2B.

It is noted that each of output-side coils 22A, 22B, 22E, and 22F extends linearly in plan view at least in the above-described region between the outer leg and middle leg. That is, each of output-side coils 22A, 22B, 22E, and 22F can be regarded as equivalent to half of a turn (0.5 turn) around its adjacent outer leg in a pseudo manner.

At one end (on the left side in FIG. 4 (A)) of the linear region interposed between outer leg 23A1 and middle leg 23A3, output-side coil 22B is bent so as to intersect approximately perpendicularly to the linearly extending direction, and reference potential 7 is connected to this bent portion. The anode of rectifier element 31A (first rectifier element) is connected in series with one end (on the right side in FIG. 4 (A)) of the linear region of output-side coil 22A interposed between outer leg 23B1 and middle leg 23B3. However, the mode having such a bent portion is not a limitation, but the coil may extend linearly from reference potential 7 to rectifier element 31A, for example. All of output-side coils 22A to 22H in subsequent FIGS. 4 to 7 similarly have a bent portion in the drawings, but this mode is not a limitation.

Also similarly, reference potential 7 is connected to a bent portion at one end (on the right side in FIG. 4 (A)) of the linear region of output-side coil 22F interposed between outer leg 23B2 and middle leg 23B3. The anode of rectifier element 31C (fourth rectifier element) is connected in series with one end (on the left side in FIG. 4 (A)) of the linear region of output-side coil 22E interposed between outer leg 23A2 and middle leg 23A3.

Referring to FIG. 4 (B), when the second lowermost layer of four-layer patterns 20A to 20D of multilayer printed board 26 is seen in plan view, input-side coils 21A and 21B are arranged on this plane as the same layer as pattern 20B of FIG. 3. That is, above-described input-side coils 21A and 21B may be considered as the same layer as pattern 20B (a film corresponding to pattern 20B), and are coils formed as a copper thin film pattern, for example.

Input-side coil 21A is arranged to pass through the region between outer leg 23A1 and middle leg 23A3, the region between outer leg 23A2 and middle leg 23A3, and the region connecting these two regions. In more detail, input-side coil 21A is in a mode of being spirally wound two turns around middle leg 23A3, for example, as shown in the drawing. Spiral input-side coil 21A is configured such that a gap is left between the first turn and the second turn to prevent them from being electrically short-circuited. Input-side coil 21A extends linearly in each of the above-described regions, and is bent approximately perpendicularly at boundaries between the respective regions. Accordingly, input-side coil 21A is wound around middle leg 23A3 so as to present a rectangular shape in plan view.

Similarly, input-side coil 21B is arranged to pass through the region between outer leg 23B1 and middle leg 23B3, the region between outer leg 23B2 and middle leg 23B3, and the region connecting these two regions. In more detail, input-side coil 21B is in a mode of being spirally wound two turns around middle leg 23B3, for example, as shown in the drawing. Spiral input-side coil 21B is configured such that a gap is left between the first turn and the second turn to prevent them from being electrically short-circuited. Input-side coil 21B extends linearly in each of the above-described regions, and is bent approximately perpendicularly at boundaries between the respective regions. Accordingly, input-side coil 21B is wound around middle leg 23B3 so as to present a rectangular shape in plan view.

Accordingly, input-side coil 21A wound around middle leg 23A3 constitutes step-down transformer 2A, and input-side coil 21B wound around middle leg 23B3 constitutes step-down transformer 2B.

Referring to FIG. 4 (C), when the third lowermost layer of four-layer patterns 20A to 20D of multilayer printed board 26 is seen in plan view, input-side coils 21A and 21B are arranged on this plane as the same layer as pattern 20C of FIG. 3. That is, above-described input-side coils 21A and 21B may be considered as the same layer as pattern 20C (a film corresponding to pattern 20C), and are coils formed as a copper thin film pattern, for example.

Input-side coils 21A and 21B shown in FIG. 4 (C) are in a mode of being spirally wound two turns around middle legs 23A3 and 23B3, for example, approximately similarly to input-side coils 21A and 21B shown in FIG. 4 (B). Two turns of input-side coils 21A and 21B shown in FIG. 4 (B) and two turns of input-side coils 21A and 21B shown in FIG. 4 (C) are electrically connected together at their ends by connection vias 25A and 25B extending in the vertical direction in FIG. 3 (thickness direction of multilayer printed board 26), and a combination of them functions as one input-side coil 21A and one input-side coil 21B. Ends of input-side coils 21A and 21B of FIG. 4 (B) opposite to the ends connected to connection vias 25A and 25B correspond to nodes 12 and 13 of FIG. 1.

A total of four turns of input-side coil 21A and a total of four turns of input-side coil 21B are thereby formed. In FIG. 4 (C), input-side coils 21A and 21B are connected in series.

Referring to FIG. 4 (D), when the uppermost layer of four-layer patterns 20A to 20D of multilayer printed board 26 is seen in plan view, four output-side coils 22C, 22D, 22G, and 22H are arranged on this plane as the same layer as pattern 20D of FIG. 3. That is, above-described output-side coils 22C, 22D, 22G, and 22H may be considered as the same layer as pattern 20D (a film corresponding to pattern 20D), and are coils formed as a copper thin film pattern, for example.

Output-side coil 22C (third output-side coil) is arranged to include a region between outer leg 23A2 and middle leg 23A3 of step-down transformer 2A, and output-side coil 22B (seventh output-side coil) connected in series with output-side coil 22C is arranged to include a region between outer leg 23B2 and middle leg 23B3 of step-down transformer 2B. Output-side coil 22G (sixth output-side coil) is arranged to include a region between outer leg 23B1 and middle leg 23B3 of step-down transformer 2B, and output-side coil 22H (second output-side coil) connected in series with output-side coil 22G is arranged to include a region between outer leg 23A1 and middle leg 23A3 of step-down transformer 2A.

Accordingly, output-side coils 22C and 22H constitute step-down transformer 2A, and output-side coils 22D and 22G constitute step-down transformer 2B. Basically, also in each of the subsequent embodiments, the output-side coil interposed between the outer leg and middle leg of core 23A on the left side in the drawing constitutes step-down transformer 2A, and the output-side coil interposed between the outer leg and middle leg of core 23B on the right side in the drawing constitutes step-down transformer 2B.

It is noted that each of output-side coils 22C, 22D, 22G, and 22H extends linearly in plan view at least in the above-described region between the outer leg and middle leg. That is, each of output-side coils 22C, 22D, 22G, and 22H can be regarded as equivalent to half of a turn (0.5 turn) around its adjacent outer leg in a pseudo manner.

Reference potential 7 is connected to a bent portion at one end (on the left side in FIG. 4 (D)) of the linear region of output-side coil 22C interposed between outer leg 23A2 and middle leg 23A3. The anode of rectifier element 31B (third rectifier element) is connected in series with one end (on the right side in FIG. 4 (D)) of the linear region of output-side coil 22D interposed between outer leg 23B2 and middle leg 23B3.

Reference potential 7 is connected to a bent portion at one end (on the right side in FIG. 4 (D)) of the linear region of output-side coil 22G interposed between outer leg 23B1 and middle leg 23B3. The anode of rectifier element 31D (second rectifier element) is connected in series with one end (on the left side in FIG. 4 (D)) of the linear region of output-side coil 22H interposed between outer leg 23A1 and middle leg 23A3.

As described above, in multilayer printed board 26, the input-side and output-side coils are formed to be stacked on one another. Middle legs 23A3 and 23B3 of E-shaped cores 23A and 23B extend through multilayer printed board 26 so as to be surrounded by these input-side and output-side coils.

The portions of above-described output-side coils 22A to 22H (interposed between the outer and middle legs) extending linearly in plan view overlap one of input-side coils 21A and 21B immediately thereabove (immediately therebelow) at least partly. Therefore, output-side coils 22A to 22H arranged as merely a half turn (0.5 turn) are larger in width than input-side coils 21A and 21B having a narrow width so as to enable spiral two-turn winding in the regions between outer legs 23A1, 23A2 and middle leg 23A3.

Since a voltage is applied to input-side coil 21 in opposite directions in the first state and the second state as described above, electric current flows in this input-side coil 21 in opposite directions in the first state and the second state. Next, changes in the flow of electric current in output-side coil 22 caused by this will be described.

Here, as shown in FIGS. 4 (B) and 4 (C), for example, the first state in which switching elements 11A and 11D (see FIG. 1) are turned on, so that a positive input voltage of DC power supply 6 is applied to input-side coil 21, causing electric current to flow from node 12 toward node 13 of switching element 11 in a direction of arrows in the drawings is discussed. At this time, electric current flows from the outside toward the inside of the spiral of input-side coil 21A (from the inside toward the outside of the spiral of input-side coil 21B) in FIG. 4 (B), and flows from the inside toward the outside of the spiral of input-side coil 21A (from the outside toward the inside of the spiral of input-side coil 21B) in FIG. 4 (C).

With this electric current, a magnetic flux S1 upward perpendicularly to the sheet of drawing occurs in middle legs 23A3 and 23B3 wound around input-side coils 21A and 21B, and a magnetic flux is created in a loop in accordance with two magnetic paths formed between outer legs 23A1, 23A2, 23B1, 23B2 and middle legs 23A3, 23B3, respectively. Therefore, a magnetic flux S2 occurs in outer legs 23A1, 23A2, 23B1, and 23B2 downward perpendicularly to the sheet of drawing in the opposite direction to a magnetic flux S1 in middle legs 23A3 and 23B3.

Referring again to FIGS. 4 (A) and (D), an induced electromotive force occurs in output-side coils 22A, 22B, 22E, and 22F so as to cancel out magnetic flux S1 in middle legs 23A3 and 23B3 in FIGS. 4 (B) and (C) described above, that is, such that magnetic flux S2 occurs in middle legs 23A3 and 23B3, and electric current is going to flow. It is noted that, at this time, magnetic flux S1 is going to occur in outer legs 23A1, 23A2, 23B1, and 23B2. Based on a similar theory to output-side coils 22A, 22B, 22E, and 22F, electric current is also going to flow in output-side coils 22C, 22D, 22G, and 22H. It is noted that the directions of magnetic fluxes which are going to occur resulting from the situations shown in FIGS. 4 (B) and (C) are indicated in cores 23A1 to 23A3 and 23B1 to 23B3 shown in FIGS. 4 (A) and (D).

For that purpose, electric current is going to flow rightward in the drawing in output-side coils 22A, 22B, 22G, and 22H, and leftward in the drawing in output-side coils 22C, 22D, 22E, and 22F. However, the electric current which is going to flow in output-side coils 22C, 22D, 22G, and 22H is interrupted by the rectifying function of rectifier elements 31B and 31D and does not flow. Actually, the electric current indicated by the arrows in FIG. 4 (A) flows only in output-side coils 22A, 22B, 22E, and 22F so as to pass through rectifier elements 31A and 31C. Specifically, since output-side coils 22A, 22B, 22E, and 22F are magnetically coupled by E-shaped cores 23A, 23B and I-shaped cores 24A, 24B, electric current flows in the opposite direction to the electric current flowing in input-side coils 21A and 21B overlapping them in plan view.

Figure 5:
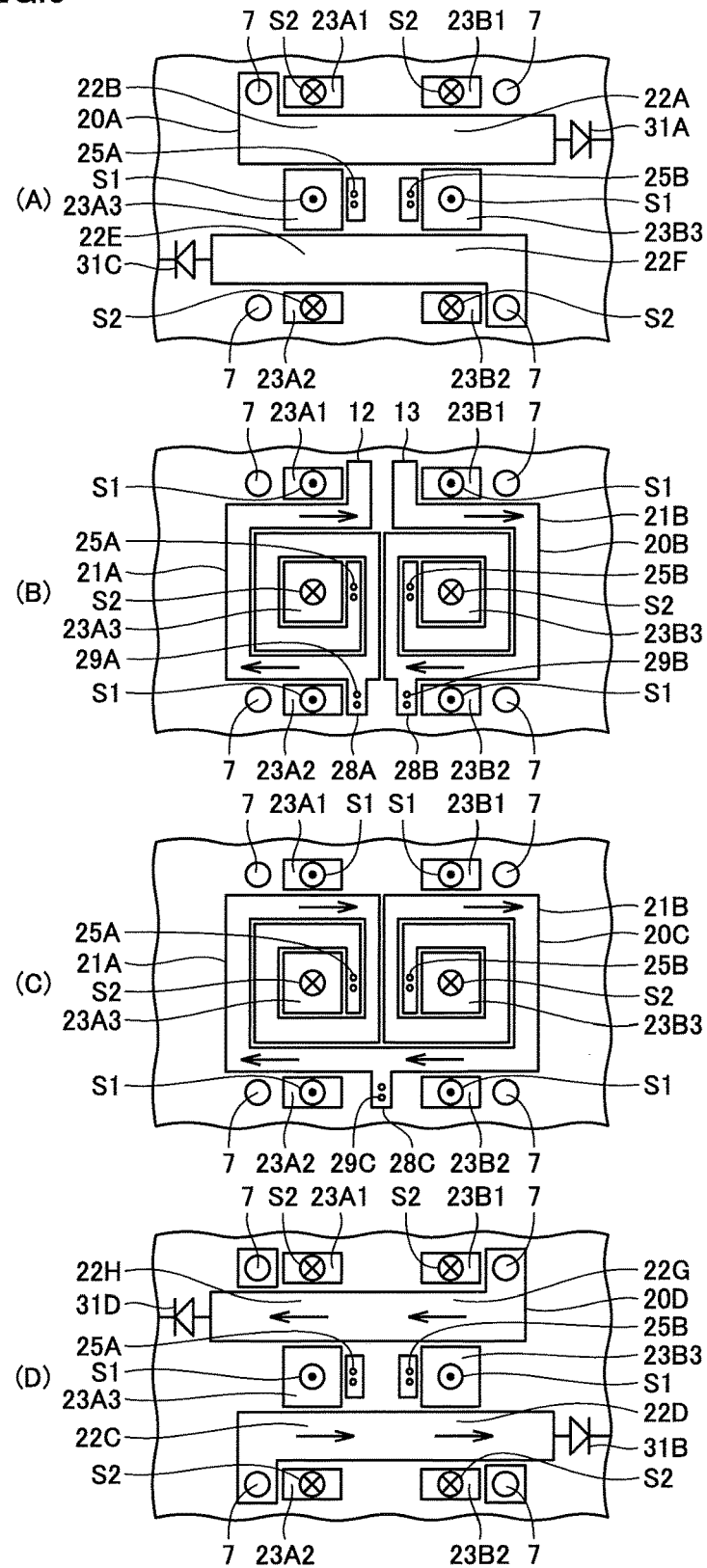

Next, as indicated by the arrows in FIG. 5 (B) and FIG. 5 (C), the second state in which switching elements 11B and 11C (see FIG. 1) are turned on, so that a negative input voltage of DC power supply 6 is applied to input-side coil 21, causing electric current to flow from node 13 toward node 12 of switching element 11 is discussed. At this time, electric current flows from the inside toward the outside of the spiral of input-side coil 21A (from the outside toward the inside of the spiral of input-side coil 21B) in FIG. 5 (B), and from the outside toward the inside of the spiral of input-side coil 21A (from the inside toward the outside of the spiral of input-side coil 21B) in FIG. 5 (C).

With these electric currents, contrary to the above case, magnetic flux S2 occurs in middle legs 23A3 and 23B3 wound around input-side coil 21A, and magnetic flux S1 occurs in outer legs 23A1, 23A2, 23B1, and 23B2.

Referring to FIGS. 5 (A) and (D), an induced electromotive force occurs in output-side coils 22A, 22B, 22E, and 22F so as to cancel out changes in magnetic flux occurred in middle legs 23A3 and 23B3 in above-described FIGS. 5 (B) and (C), that is, such that magnetic flux S1 occurs, and electric current is going to flow. It is noted that, at this time, magnetic flux S2 is going to occur in outer legs 23A1, 23A2, 23B1, and 23B2. The same applies to output-side coils 22C, 22D, 22G, and 22H. The directions of magnetic fluxes which are going to occur are indicated in cores 23A1 to 23A3 and 23B1 to 23B3 in FIGS. 5 (A) and (D).

For that purpose, electric current is going to flow leftward in the drawing in output-side coils 22A, 22B, 22G, and 22H, and rightward in the drawing in output-side coils 22C, 22D, 22E, and 22F. However, the electric current which is going to flow in output-side coils 22A, 22B, 22E, and 22F is interrupted by the rectifying function of rectifier elements 31A and 31C, and does not flow. Actually, the electric current indicated by the arrows in FIG. 5 (D) flows only in output-side coils 22C, 22D, 22G, and 22H so as to pass through rectifier elements 31B and 31D. Similarly to the above case, electric current flows in output-side coils 22C, 22D, 22G, and 22H in the opposite direction to the electric current flowing in input-side coils 21A and 21B overlapping them in plan view.

Figure 6:
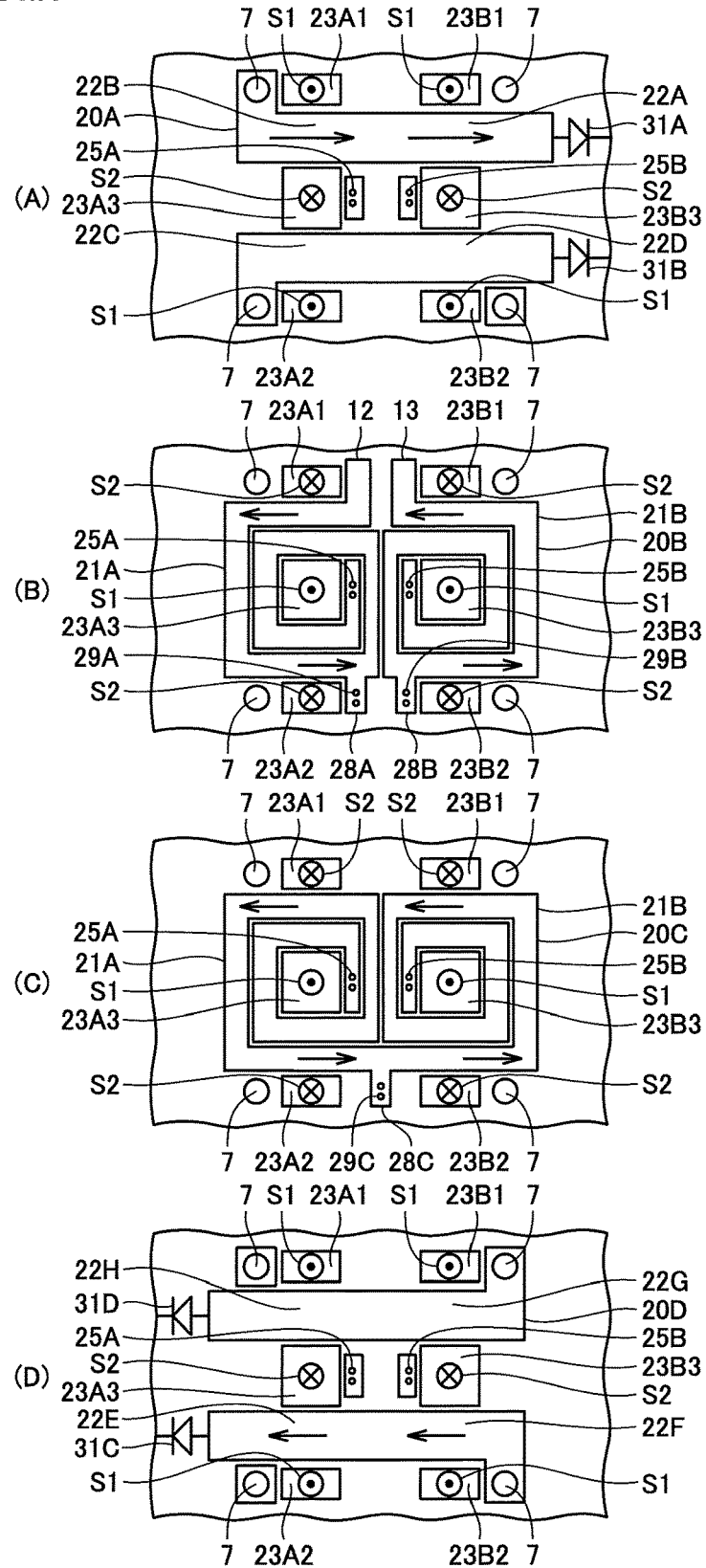
Figure 7:
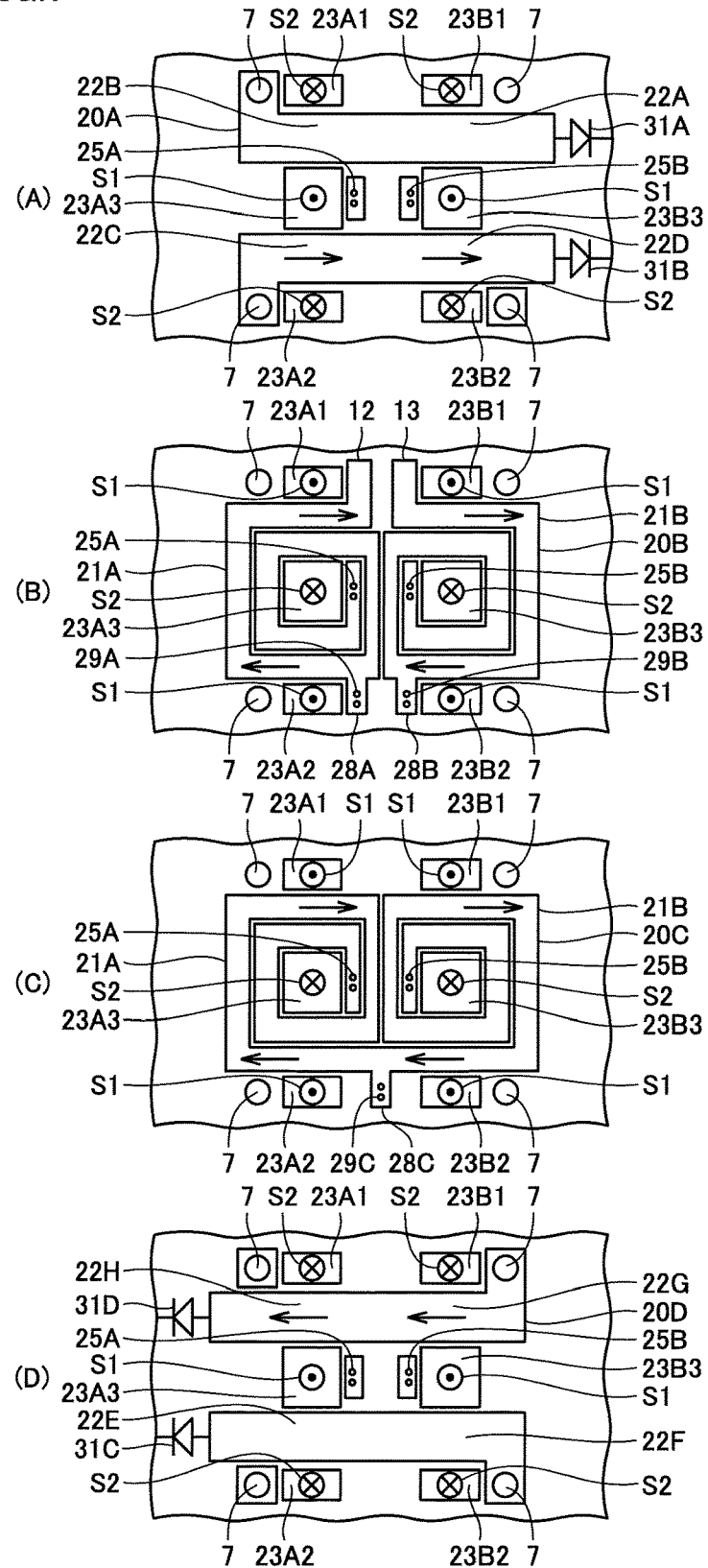

Next, referring to FIG. 6 (A) to (D) and FIG. 7 (A) to (D), in a second example of the present embodiment, the same reference characters are allotted to parts similar in configuration to the first example shown in FIGS. 4 and 5, and description thereof will not be repeated. In the second example of the present embodiment shown in FIG. 6 (A) to (D), output-side coil 22A (fifth output-side coil), output-side coil 22B (first output-side coil), output-side coil 22G (sixth output-side coil) and output-side coil 22H (second output-side coil) are similar to those in the above-described first example. FIGS. 6 (B) and (C) is basically similar to FIGS. 4 (B) and (C).

In FIG. 6 (A), however, the series connection of output-side coil 22C (third output-side coil) and output-side coil 22D (seventh output-side coil) is arranged as the same layer as pattern 20A. In FIG. 6 (D), the series connection of output-side coil 22E (fourth output-side coil) and output-side coil 22F (eighth output-side coil) is arranged as the same layer as pattern 20D. FIG. 6 differs from FIG. 4 in this regard.

Referring to FIG. 6, the operation in the first state in which switching elements 11A and 11D (see FIG. 1) are turned on, that is, the directions of magnetic fluxes in cores 23A1 to 23A3 and 23B1 to 23B3 and the directions of electric currents in input-side coils 21A, 21B and output-side coils 22A to 22H are basically similar to those in FIG. 4. Referring to FIG. 7, the operation in the second state in which switching elements 11B and 11C (see FIG. 1) are turned on, that is, the directions of magnetic fluxes in cores 23A1 to 23A3 and 23B1 to 23B3 and the directions of electric currents in input-side coils 21A, 21B and output-side coils 22A to 22H are basically similar to those in FIG. 5.

Figure 8:
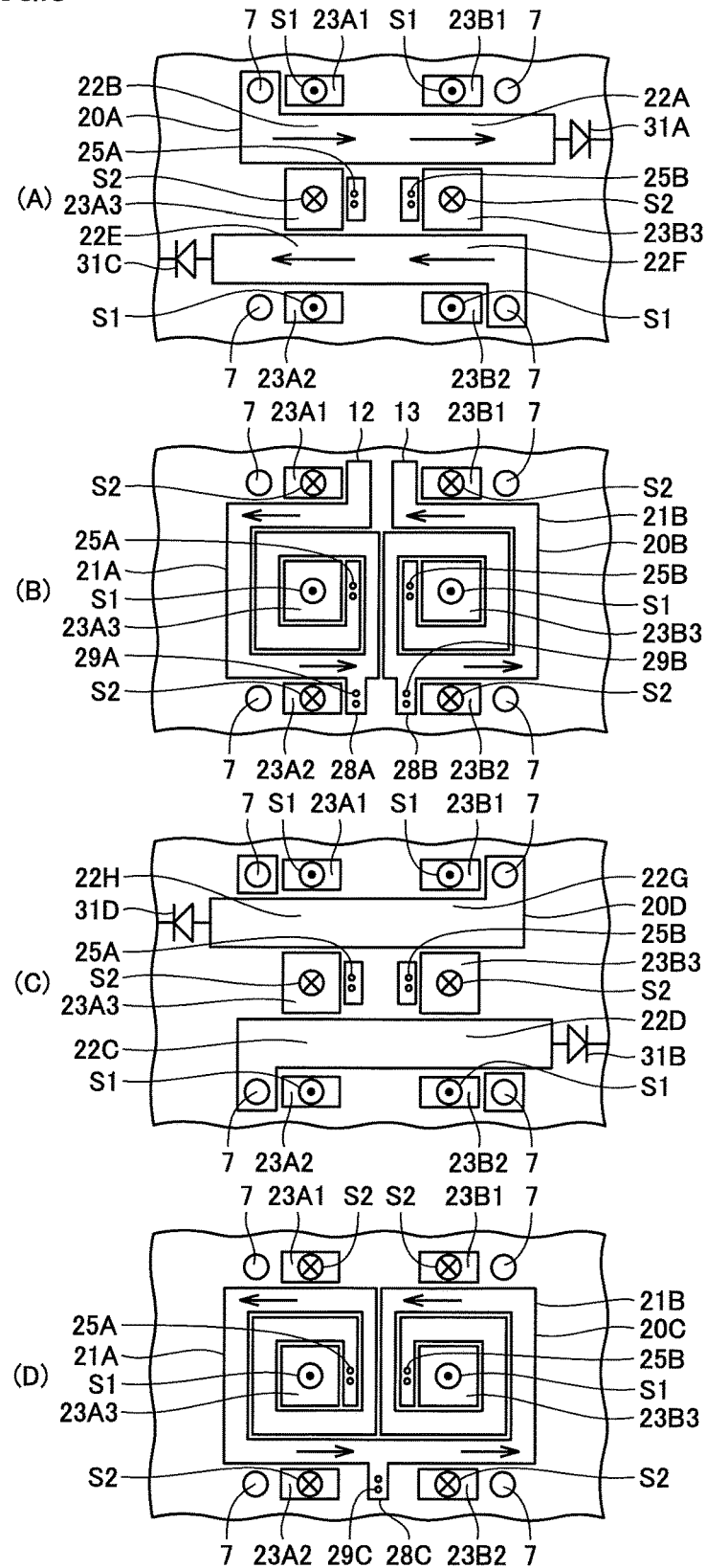

Next, referring to FIG. 8 (A) to (D), an insulation type step-down converter in a third example of the present embodiment basically has a similar configuration to the first example. Here, however, third-layer pattern 20C and fourth-layer pattern 20D are configured in a reverse manner to FIGS. 4 (C) and (D) although first-layer pattern 20A and second-layer pattern 20B of multilayer printed board 26 (see FIG. 3) are the same as those in FIGS. 4 (A) and (B). That is, output-side coils 22C, 22D, 22G, and 22H identical to those shown in FIG. 4 (D) correspond to third-layer pattern 20C shown in FIG. 8 (C), and input-side coils 21A and 21B identical to those shown in FIG. 4 (C) correspond to fourth-layer pattern 20D shown in FIG. 8 (D).

That is, in the first example, patterns 20A, 20B, 20C, and 20D are stacked in this order so as to correspond to an output-side coil, an input-side coil, an input-side coil, and an output-side coil, respectively. However, this is not a limitation, but patterns 20A, 20B, 20C, and 20D may be stacked in this order so as to correspond to an output-side coil, an input-side coil, an output-side coil, and an input-side coil, respectively, as in the third example. Although not shown, patterns 20A, 20B, 20C, and 20D may be stacked in this order so as to correspond to an output-side coil, an output-side coil, an input-side coil, and an input-side coil, respectively.

FIG. 8 differs from FIG. 4 only in the order of stacking of the respective layers, and the mode of each layer is identical to any of FIG. 4 (A) to (D). Therefore, in the third example of the present embodiment, the operations in the above-described first and second states are similar to those in the first and second examples.

Next, changes in voltage applied to each coil and in current flowing in each smoothing coil between the above-described respective states will be described using FIG. 9.

Figure 9:
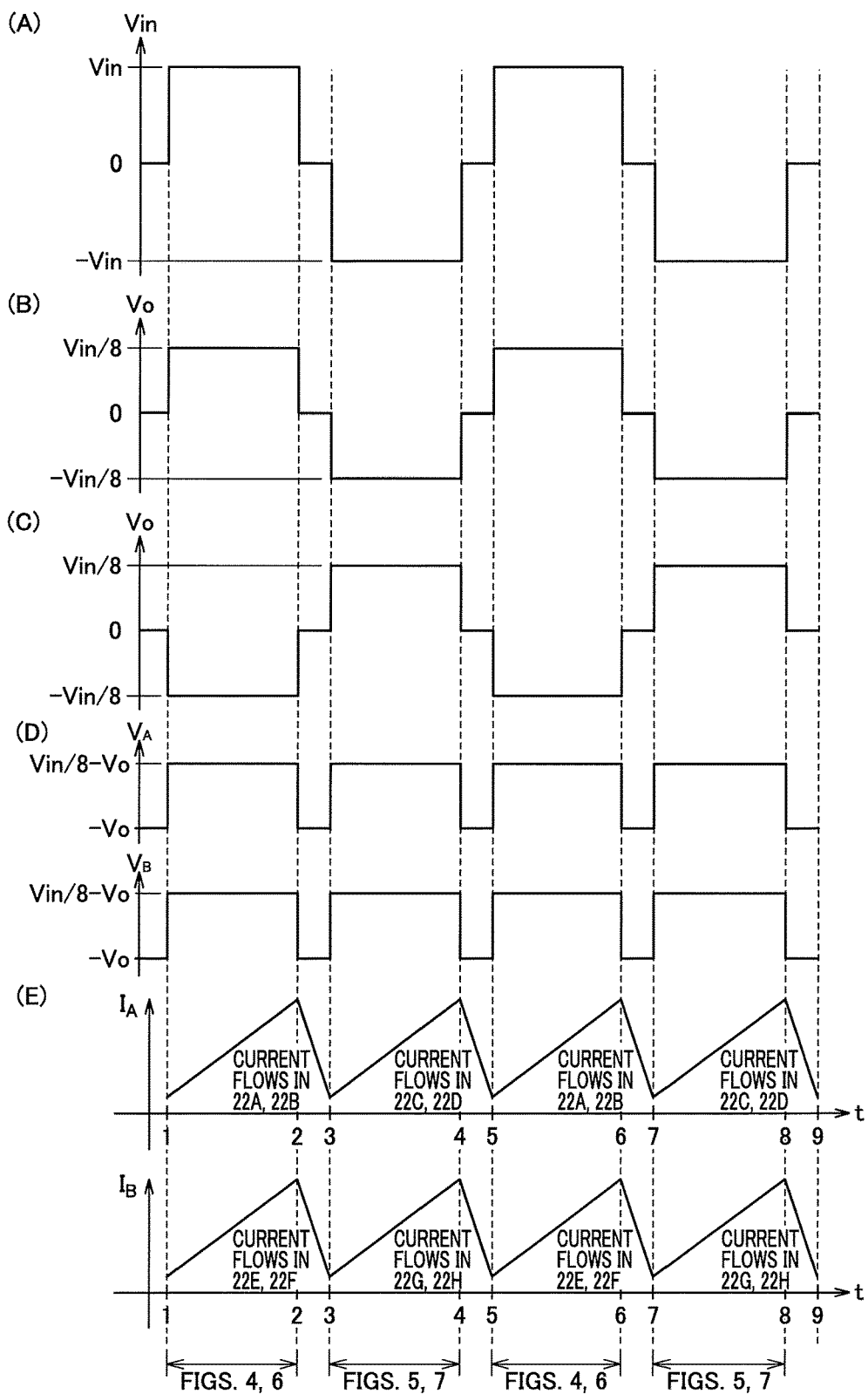
FIG. 9 shows a graph (A) showing time changes in voltage applied to input-side coils, a graph (B) showing time changes in voltage applied to output-side coils 22A, 22B, 22E, and 22F, a graph (C) showing time changes in voltage applied to output-side coils 22C, 22D, 22G, and 22H, a graph (D) showing time changes in voltage applied to smoothing coils, and a graph (E) showing time changes in electric current flowing in the smoothing coils.

Referring to FIG. 9 (A), when in the first state shown in FIGS. 4 and 6, a positive voltage Vin is applied in total to input-side coils 21A and 21B by input-side drive circuit 1. Thus, a voltage of Vin/2 is applied to each of input-side coil 21A and input-side coil 21B.

As shown in FIG. 9 (B), at this time, a positive voltage is applied to each of the series connection of output-side coils 22A and 22B (first series coils) and the series connection of output-side coils 22E and 22F (fourth series coils) in which electric current flows. Here, depending on the ratio of the number of turns of the input-side coil to that of the output-side coil in step-down transformers 2A and 2B, the voltage in the output-side coil is lower than the voltage in the input-side coil (a total voltage in output-side coils 22A and 22B connected in series, for example, is Vin/8). Accordingly, a voltage applied to each output-side coil such as output-side coil 22A, for example, is then half of the voltage, which is Vin/16.

Referring to FIG. 9 (C), at this time, a negative voltage reversed in phase (shifted by 180°) relative to output-side coils 22A, 22B, 22E, and 22F is applied to the series connection of output-side coils 22C and 22D (third series coils) and the series connection of output-side coils 22G and 22H (second series coils), which is −Vin/8 in total for the two series connections here (−Vin/16 for each coil). Such a voltage is applied to output-side coils 22C, 22D, 22G, and 22H, but the electric current is interrupted by rectifier elements 31B and 31D as described above.

Next, when in the second state shown in FIGS. 5 and 7, a negative voltage −Vin reversed in phase relative to the first state is applied in total to input-side coils 21A and 21B as shown in FIG. 9 (A). As shown in FIG. 9 (B), at this time, a negative voltage (a total for the two series connections is −Vin/8) is applied to each of the series connection of output-side coils 22A and 22B (first series coils) and the series connection of output-side coils 22E and 22F (fourth series coils) in which electric current does not flow.

As shown in FIG. 9 (C), at this time, a voltage is applied to the series connection of output-side coils 22C and 22D (third series coils) and the series connection of output-side coils 22G and 22H (second series coils) in which electric current flows, such that a total for the two series connections is positive voltage Vin/8.

Both in the above-described first and second states, a mode is brought about in which a voltage produced in the output-side coil (output from the output-side coil) is similar to the DC voltage applied only in one direction by rectification of electric current in rectifier elements 31A to 31D, and is further smoothed in smoothing capacitor 41 and smoothing coil 42. A smoothed DC voltage Vo is thereby applied to the both ends of smoothing capacitor 41.

Here, operation effects of the insulation type step-down converters of the above-described present embodiment will be described.

First, voltages in opposite directions to each other can be applied to the series connection of input-side coils 21A and 21B by input-side drive circuit 1 at regular time intervals. A DC input voltage can thereby be converted into an AC voltage, which allows a step-down by the mutual induction in step-down transformer 2.

As shown in FIG. 4 and FIG. 5, for example, input-side coil 21A and each of output-side coils 22B, 22E, 22H, and 22C are arranged so as to overlap each other at least partly in step-down transformer 2A. Similarly, input-side coil 21B and each of output-side coils 22A, 22F, 22G, and 22D are arranged so as to overlap each other at least partly in step-down transformer 2B. Therefore, the mutual induction effect in which electric current is going to flow to output-side coil 22 in the direction opposite to the direction of electric current in input-side coil 21 can be highly obtained so as to cancel out changes in magnetic flux caused by the electric current in input-side coil 21.

In the present embodiment, rectifier elements 31A to 31D rectify the electric currents in output-side coils 22A to 22H which are going to flow so as to produce magnetic fluxes which cancel out changes in magnetic fluxes S1 and S2 passing through middle legs 23A3 and 23B3 each time when the direction of electric current flowing in input-side coils 21A and 21B is changed between the two states shown in FIGS. 4 and 5 (FIGS. 6 and 7). That is, electric currents flow simultaneously only in either output-side coils 22A and 22B as the first series coils or output-side coils 22G and 22H as the second series coils, and either output-side coil 22C and 22D as the third series coils or output-side coils 22E and 22F as the fourth series coils, in an alternate manner (at regular time intervals). Here, electric currents flow simultaneously in the above-described first and fourth series coils, and simultaneously in the above-described second and third series coils, in an alternate manner.

By the rectification performed by rectifier elements 31A to 31D such that electric current flows alternately as described above, an AC voltage obtained by mutual induction between input-side coils 21A, 21B and output-side coils 22A to 22H can be converted into a DC voltage to obtain a DC output. Furthermore, the smoothing circuit can further stabilize the DC output value.

In addition, the directions of electric currents flowing simultaneously in first series coils 22A, 22B and fourth series coils 22E, 22F are opposite to each other. Specifically, in FIG. 4 (FIG. 6), for example, electric current is flowing rightward in first series coils 22A and 22B, and leftward in fourth series coils 22E and 22F. Similarly, the directions of electric currents flowing simultaneously in second series coils 22G, 22H and third series coils 22C, 22D are opposite to each other. Specifically, in FIG. 5 (FIG. 7), for example, electric current is flowing leftward in second series coils 22G and 22H, and rightward in third series coils 22C and 22D. Accordingly, two linear output-side coils (for example, the first and fourth series coils) (equivalent to a 0.5 turn) in which electric currents flow simultaneously can be collectively made equivalent to a turn of a coil in a pseudo manner. This can cause step-down transformers 2A and 2B to achieve the step-down function using a turn of output-side coils 22A to 22H.

However, although the state of a turn is created in a pseudo manner as described above, the circuit as a whole is in the state in which output-side coils 22A to 22D of 0.5 turn are aligned. Therefore, when considering the step-down ratio of step-down transformers 2A and 2B, whole output-side coils 22A to 22H can be considered to be equivalent to a coil of 0.5 turn combining these plurality of output-side coils 22A to 22H. Here, the step-down ratio refers to a ratio of a voltage of the high-voltage input-side coil to a voltage of the low-voltage output-side coil of step-down transformers 2A and 2B.

First series coils 22A, 22B and third series coils 22C, 22D are connected to first smoothing coil 42A, and second series coils 22G, 22H and fourth series coils 22E, 22F are connected to second smoothing coil 42B. Accordingly, electric currents flowing in the first and third series coils flow to smoothing coil 42A, and electric currents flowing in the second and fourth series coils flow to smoothing coil 42B.

Referring now to FIG. 9 (D), the upper graph of two vertically aligned graphs shows time changes in voltage applied to smoothing coil 42A, and the lower graph shows time changes in voltage applied to smoothing coil 42B. The horizontal axis of these graphs indicates, in conformity with the horizontal axis of FIG. 9 (A) to (C), time change in the first state shown in FIG. 4 (FIG. 6) and the second state shown in FIG. 5 (FIG. 7), and the vertical axis indicates a voltage value $V_A$ of smoothing coil 42A or a voltage value $V_B$ of smoothing coil 42B.

As shown in FIG. 9 (D), when in the first state of FIG. 4 (FIG. 6), electric current flowing in output-side coils 22A and 22B (first series coils) flows to smoothing coil 42A by rectifier element 31A. At this time, a voltage of Vin/8−Vo is applied to smoothing coil 42A. This is a value obtained by subtracting the voltage of smoothing capacitor 41 from the high-voltage-side voltage of output-side coils 22A and 22B. Similarly, electric current flowing in output-side coils 22E and 22F (fourth series coils) flows to smoothing coil 42B by rectifier element 31C, and the voltage of Vin/8−Vo is also applied to smoothing coil 42B at this time.

When in the second state of FIG. 5 (FIG. 7), electric current flowing in output-side coils 22C and 22D (third series coils) flows to smoothing coil 42A by rectifier element 31B, and electric current flowing in output-side coils 22G and 22F1 (second series coils) flows to smoothing coil 42B by rectifier element 31D. Similarly to the above case, the voltage of Vin/8−Vo is applied to smoothing coils 42A and 42B at this time.

If neither of the first and second states applies and no electric current flows in smoothing coils 42A and 42B, a reverse voltage −Vo of smoothing coil 41 is applied. The gradient of each of the electric currents flowing in smoothing coils 42A and 42B in each state corresponds to a value obtained by dividing the value of an applied voltage by the value of an inductance of the coil.

Referring to FIG. 9 (E), the upper graph of two vertically aligned graphs shows an electric current value $I_A$ in smoothing coil 42A, and the lower graph shows an electric current value $I_B$ in smoothing coil 42B. It is noted that elapsed times 1 to 9 along the horizontal axis each indicate, as a relative value of a dimensionless number, the time at which electric current value $I_A$ or $I_B$ indicates the local maximum or the local minimum.

In FIG. 9 (A), the voltages applied to input-side coils 21A and 21B are almost equal in value between two step-down transformers 2A and 2B, and in FIGS. 9 (B) and (C), the voltages in four output-side coils 22B, 22E, 22H, and 22C of step-down transformer 2A and the voltages in four output-side coils 22A, 22F, 22G, and 22D of step-down transformer 2B are almost equal in value. Accordingly, as shown in FIGS. 9 (D) and (E), the voltages applied to and currents flowing in smoothing coils 42A and 42B are equal in value. This is a state in which coupling balance is achieved between step-down transformers 2A and 2B because of the coupling balance between the input-side coil and output-side coil, for example.

However, due to various factors responsible for unbalance, for example, the voltages in four output-side coils 22B, 22E, 22H, and 22C of step-down transformer 2A may become higher in value, for example, than the voltages in four output-side coils 22A, 22F, 22G, and 22D of step-down transformer 2B. Also in this case, however, in the present embodiment, the voltages applied to the first to fourth series coils are equal in waveform, and their amplitudes (the sum of voltage values of the two output-side coils connected in series) are almost equal in value (V, for example). This is because, in the above-described case, output-side coil 22B having a high voltage and output-side coil 22A having a low voltage are connected in series (output-side coil 22E (/22H/22C) having a high voltage and output-side coil 22F (/22G/22D) having a low voltage are similarly connected in series).

Accordingly, smoothing coil 42A in which electric current of either the first or third series coils flows and smoothing coil 42B in which electric current of either the second or fourth series coils flows become equal in value.

As described above, according to the configuration of the present embodiment in which the respective output-side coils of the two step-down transformers are connected in series, even if coupling unbalance occurs between the two step-down transformers resulting in different voltage values between the output-side coils of the two transformers, the electric current values of two smoothing coils 42A and 42B can be made equal. Thus, it is not required to leave a margin of smoothing coils 42A and 42B due to electric current unbalance between two smoothing coils 42A and 42B, thereby reducing the size of smoothing coils 42A and 42B.

Additionally, in the present embodiment, output-side coils 22A to 22H wound a 0.5 turn between outer legs 23A1, 23A2, 23B1, 23B2 and middle legs 23A1, 23B1 are adopted.

Accordingly, since the number of turns of the output-side coils is small, the current-carrying distance of the output-side coils can be shortened.

It is noted that in the present embodiment, since each of input-side coils 21A and 21B is a four-turn coil and each of output-side coils 22A to 22H is a 0.5-turn coil, the step-down ratio of step-down transformers 2A and 2B is 8:1. However, by changing the number of turns of input-side coils 21A and 21B, for example, such that the input-side coils have three turns, a step-down ratio of 6:1 is attained, and such that the input-side coils have five turns, a step-down ratio of 10:1 is attained.

The radiation path of the above-described step-down transformer will be described finally using FIG. 10.

Figure 10:
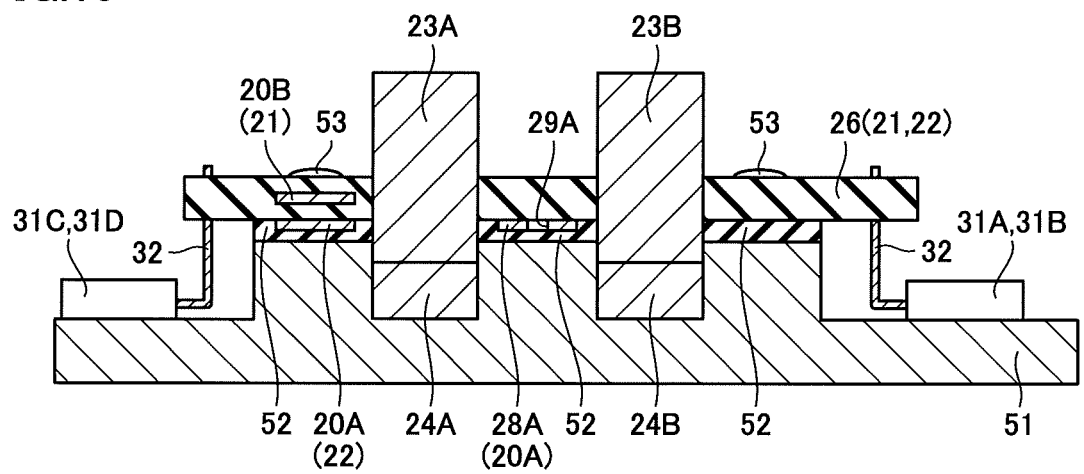
FIG. 10 is a schematic sectional view showing a mode in which a portion along the line X-X in FIG. 2 according to the first embodiment has been assembled and set in a radiator.

Referring to FIG. 10, the step-down transformer after assembly at a portion along the line X-X in FIG. 2 mainly has a radiator 51, I-shaped cores 24A and 24B mounted on the upper surface of radiator 51, for example, so as to come into contact with the upper surface, E-shaped cores 23A and 23B mounted on the surfaces of I-shaped cores 24A and 24B (so as to come into contact with the surface of radiator 51), and multilayer printed board 26 on the surface of radiator 51.

Although not clearly shown in the drawing, one end of a pair of ends of each of the first to fourth series coils of output-side coils 22 formed in multilayer printed board 26 in the above-described mode is (electrically) connected to a corresponding one of rectifier elements 31 (31A to 31D) mounted on the surface of radiator 51 with a wire 32. On the other hand, the other end opposite to the above-described one end of the pair of ends of each of the first to fourth series coils leads to radiator 51.

Accordingly, each of step-down transformers 2A and 2B is mounted so as to come into contact with radiator 51 on its lower side. To put it conversely, each of step-down transformers 2A and 2B is mounted on the surface of radiator 51.

Specifically, multilayer printed board 26 is mounted so as to at least partly come into contact with radiator 51 with an insulating sheet 52 (insulating component) interposed therebetween. More specifically, insulating sheet 52 is arranged between radiator 51 and at least one of input-side coils 21 (21A and 21B) and at least one of first to eighth output-side coils 22 (22A to 22H) of multilayer printed board 26. Insulating sheet 52 is mounted on at least part of the surface of radiator 51, and multilayer printed board 26 is mounted so as to come into contact with at least part of insulating sheet 52. Thus, multilayer printed board 26 can also be mounted such that output-side coils 22A, 22B and the like corresponding to pattern 20A (see FIG. 3) of the lowermost layer formed in multilayer printed board 26 come into direct contact with insulating sheet 52. It is noted that the sectional shape of radiator 51 is merely an example, and is not limited to this.

Heat generated by driving at least one of input-side coils 21A and 21B and at least one of output-side coils 22A to 22H can be transferred to radiator 51 through insulating sheet 52. Input-side coil 21 and output-side coil 22 of multilayer printed board 26 are thereby cooled. Radiator 51 can be air-cooled or water-cooled to radiate heat.

Output-side coil 22 of multilayer printed board 26 is preferably fixed to radiator 51 with screws 53. With these screws 53, multilayer printed board 26 can be stably fixed to radiator 51, and heat and electricity can be easily transferred from output-side coil 22 to radiator 51 through screws 53. Heat generated by output-side coil 22 can also be transferred through the contact surface between pattern 20A (see FIG. 3) of the lowermost layer of multilayer printed board 26 and radiator 51. Output-side coil 22 and radiator 51 can be electrically connected to each other through the contact surface between pattern 20A (see FIG. 3) of the lowermost layer of multilayer printed board 26 and radiator 51.

Summarizing the foregoing, there are three heat transfer paths in total (partly not shown) from output-side coil 22 (pattern 20A) of multilayer printed board 26 to radiator 51. Specifically, the three paths include a path along which heat is directly transferred from output-side coil 22 to radiator 51, a path along which heat is transferred from output-side coil 22 to radiator 51 through screws 53 fixing output-side coil 22 (with screws 53 interposed therebetween), and a path along which heat is transferred from output-side coil 22 to radiator 51 through insulating sheet 52. Among them, the above-described first and second paths can also serve as paths of electric currents from output-side coil 22 to radiator 51.

Radiator 51 of the present embodiment can also be arranged as reference potential 7 of an output-side drive circuit including output-side coils 22 (22A to 22H) of step-down transformer 2A. If pattern 20A (see FIG. 3) of the lowermost layer formed in multilayer printed board 26 is an output-side coil as described above, an input-side coil as pattern 20B (see FIG. 3) of the second layer is arranged on this output-side coil, and radiator 51 on which the output-side coil is mounted is arranged below the output-side coil. In this case, therefore, at least one of output-side coils 22A to 22H (22) can be arranged between radiator 51 and at least one of input-side coils 21A and 21B (21).

In multilayer printed board 26, input-side coil 21 and output-side coil 22 need to be insulated by insulating substrate body 37 shown in FIG. 3 such that a relatively strict standard is met. However, insulating sheet 52 interposed between output-side coil 22 corresponding to pattern 20A of the lowermost layer of multilayer printed board 26 and radiator 51 which is reference potential 7 on the output side does not need to meet a very strict insulating standard, as compared to an example where insulating sheet 52 is interposed between input-side coil 21 and radiator 51. Insulating sheet 52 interposed between output-side coil 22 and radiator 51 can thus be reduced in thickness. Thus, heat generated by input-side coil 21 and output-side coil 22 can be transferred to radiator 51 more easily because of the interposition of insulating sheet 52.

Input-side coil 21 in multilayer printed board 26 has three paths: one for transferring heat to radiator 51 through substrate body 37 of multilayer printed board 26; one for transferring heat to radiator 51 through connection vias 25 (see FIGS. 4 (B) and (C)) and insulating sheet 52; and one for transferring heat to radiator 51 from radiation patterns 28A, 28B, and 28C through a pattern (not shown). Therefore, heat generated by input-side coil 21 can be radiated with high efficiency.

Next, referring again to FIGS. 4 to 7, radiation pattern 28A is formed so as to be connected to input-side coil 21A and radiation pattern 28B is formed so as to be connected to input-side coil 21B in (B) and (C) of each drawing. Between radiation patterns 28A and 28B, radiation pattern 28C may be formed so as to be connected to a connecting portion of input-side coils 21A and 21B of the third layer.

Radiation patterns 28A, 28B, and 28C are arranged to be aligned in the horizontal direction in FIG. 4 (B), for example, at a position between outer leg 23A2 of E-shaped core 23A and outer leg 23B2 of E-shaped core 23B in plan view, for example. Radiation patterns 28A and 28B, and 28C are formed as the same layers as patterns 20B and 20C, respectively, that is, as copper thin film patterns, for example, similarly to input-side coil 21. In radiation patterns 28A, 28B, and 28C, radiation vias 29A, 29B, and 29C as through-holes are formed, respectively, so as to extend therethrough in the thickness direction of multilayer printed board 26.

Radiation vias 29A to 29C are copper plated on their wall surfaces therein. The thermal conductivity of the copper plating is utilized to conduct heat generated by input-side coil 21 into radiation vias 29A to 29C, to transfer the heat to a pattern (not shown) formed on the lowermost layer, for example. If this pattern (not shown) is in contact with insulating sheet 52, for example, heat generated by input-side coil 21 and the like is transferred through insulating sheet 52 to radiator 51 immediately therebelow. The heat is then discharged from radiator 51.

Heat of pattern 20A of output-side coil 22 of the first layer (A) and pattern 20D of output-side coil 22 of the fourth layer (D) in FIGS. 4 to 7, for example, is transferred through insulating sheet 52 (after transferring within multilayer printed board 26), for example, to radiator 51 immediately therebelow. Alternatively, heat of patterns 20A and 20D may be transferred along a route from reference potential 7 to radiator 51.

In FIG. 10, by way of example, radiation pattern 28A (pattern 20A: the same layer as part of output-side coil 22) is mounted so as to come into contact with the upper surface of insulating sheet 52 at the center. Accordingly, with radiation patterns 28A to 28C and radiation vias 29A to 29C, heat of input-side coil 21 and output-side coil 22 can be transferred to insulating sheet 52 and radiator 51 with higher efficiency.

However, FIGS. 4 to 7 may be in a mode in which radiation patterns 28A to 28C and radiation vias 29A to 29C are not formed in any of the first layer (A) to the fourth layer (D). Alternatively, for example, radiation patterns 28A to 28C (different from radiation patterns 28A to 28C connected to input-side coil 21 and the like) and radiation vias 29A to 29C may be connected in (A) and (D) in each of FIGS. 4 to 7, that is, to the same layer as output-side coil 22, from which heat is radiated to radiator 51.

Radiator 51 described above may be integral with a housing (not shown) which houses respective components of insulation type step-down converter 101 of the present embodiment. In this case, the other end opposite to the above-described one end of the pair of ends of each of output-side coils 22 (22A to 22H) leads to the housing.

Second Embodiment

A second embodiment differs from the first embodiment in the following points. Here, the differences of the second embodiment from the first embodiment will be described using FIG. 11 showing a circuit configuration of the present embodiment and FIGS. 12 to 13 showing a mode of the coils of each layer in a first example of the present embodiment.

Figure 11:
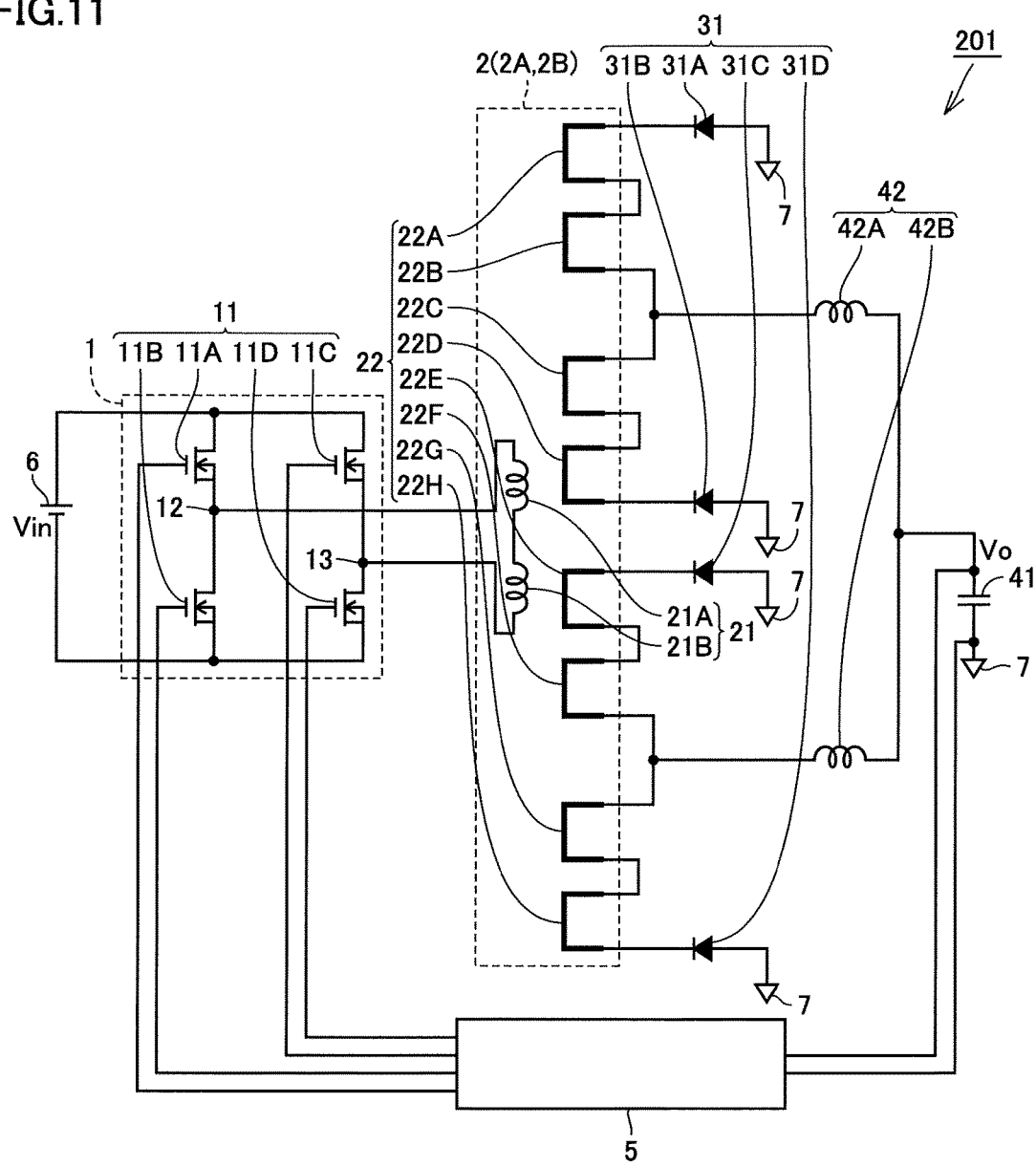
FIG. 11 is a circuit block diagram of an insulation type step-down converter of a second embodiment.
Figure 12:
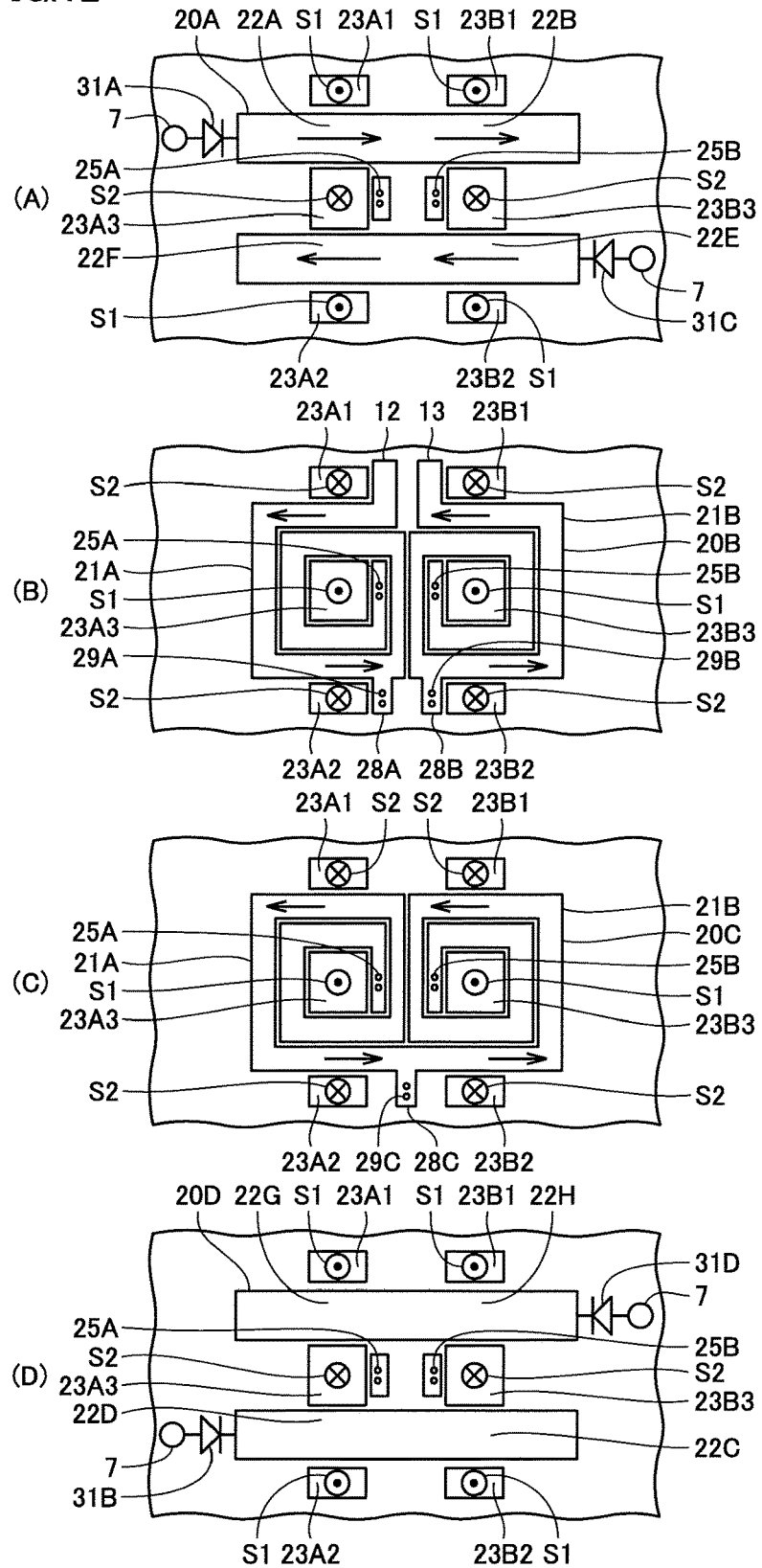
Figure 13:
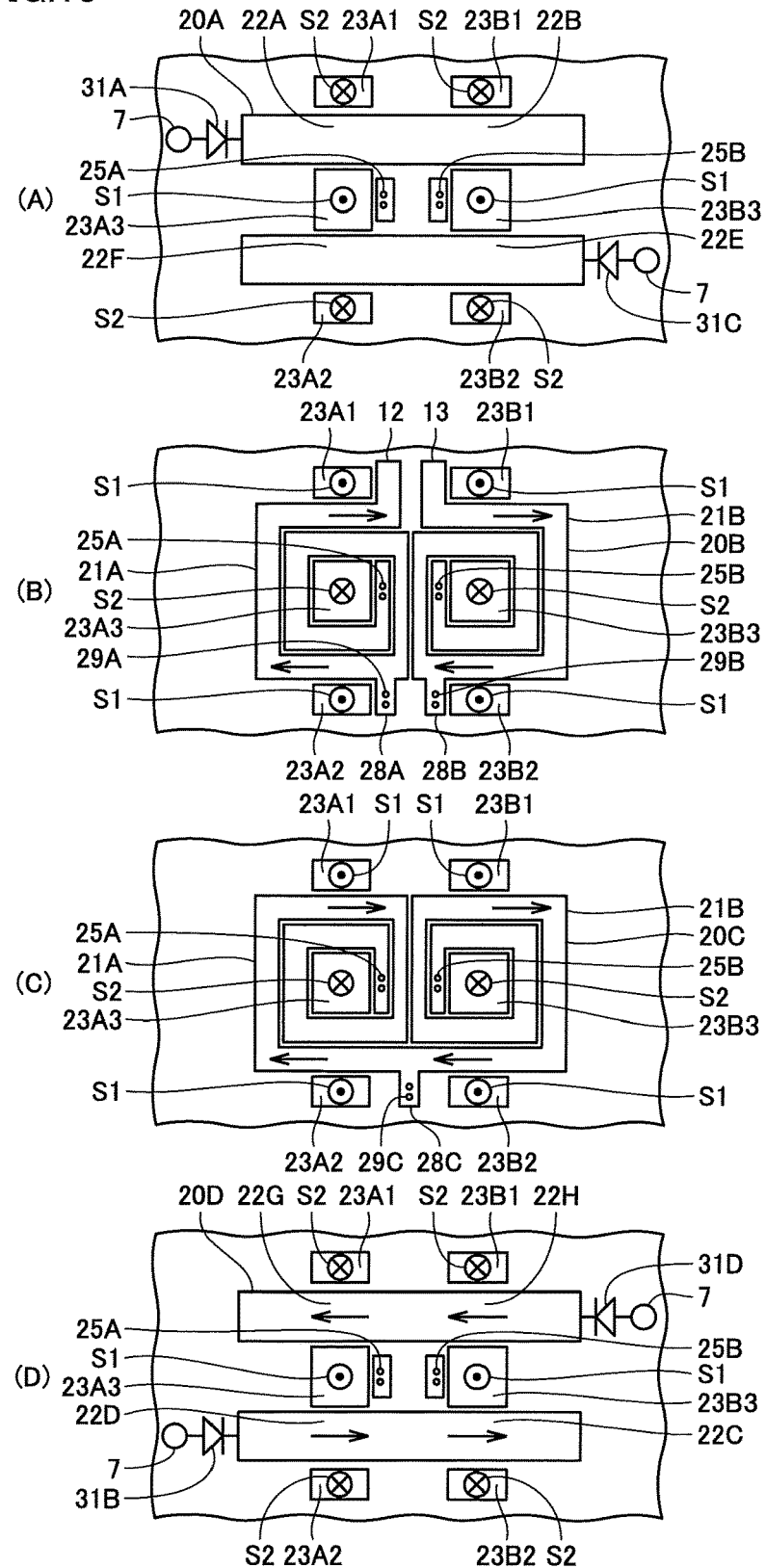

Referring to FIGS. 11 to 13, an insulation type step-down converter 201 in the first example of the present embodiment basically has a similar configuration to insulation type step-down converter 101 of the first embodiment. However, in insulation type step-down converter 201, both reference potential 7 and the cathode of rectifier element 31A are connected to one end (end on the side of output-side coil 22A) of a pair of ends of output-side coils 22A and 22B connected in series. In this regard, the present embodiment (FIG. 11) differs from the configuration of the first embodiment (FIG. 1) in which one end (end on the side of output-side coil 22B) of the pair of ends of output-side coils 22A and 22B connected in series is connected to reference potential 7, and the other end (end on the side of output-side coil 22A) is connected to the anode of rectifier element 31A.

Specifically, one ends of a total of four sets of series coils such as output-side coils 22A and 22B (first series coils) connected in series are connected to the cathodes of rectifier elements 31A to 31D, respectively, and the other ends are connected to smoothing coils 42A and 42B. The anodes of rectifier elements 31A to 31D are connected to reference potential 7. It is noted that in FIG. 12 (A), (D) and FIG. 13 (A), (D), output-side coils 22 are not bent at the ends connected to reference potential 7, different from FIGS. 4 (A) and (D), but this is not an essential part of the embodiment. In FIGS. 12 (A) and (D), output-side coils 22 may be bent similarly to those in FIGS. 4 (A) and (D).

Referring to FIG. 12 (A), output-side coil 22A (first output-side coil) is arranged to include a region between outer leg 23A1 and middle leg 23A3 of step-down transformer 2A, and output-side coil 22B (fifth output-side coil) connected in series with output-side coil 22A is arranged to include a region between outer leg 23B1 and middle leg 23B3 of step-down transformer 2B. Output-side coil 22E (eighth output-side coil) is arranged to include a region between outer leg 23B2 and middle leg 23B3 of step-down transformer 2B, and output-side coil 22F (fourth output-side coil) connected in series with output-side coil 22E is arranged to include a region between outer leg 23A2 and middle leg 23A3 of step-down transformer 2A. The cathode of rectifier element 31A and reference potential 7 are connected to the end of output-side coil 22A on the left side in the drawing, and the cathode of rectifier element 31A and reference potential 7 are connected to the end of output-side coil 22E on the right side in the drawing. FIGS. 12 (B) and (C) is basically similar to FIGS. 4 (B) and (C).

Referring to FIG. 12 (D), output-side coil 22C (seventh output-side coil) is arranged to include a region between outer leg 23B2 and middle leg 23B3 of step-down transformer 2B, and output-side coil 22D (third output-side coil) connected in series with output-side coil 22C is arranged to include a region between outer leg 23A2 and middle leg 23A3 of step-down transformer 2A. Output-side coil 22G (second output-side coil) is arranged to include a region between outer leg 23A1 and middle leg 23A3 of step-down transformer 2A, and output-side coil 22H (sixth output-side coil) connected in series with output-side coil 22G is arranged to include a region between outer leg 23B1 and middle leg 23B3 of step-down transformer 2B. The cathode of rectifier element 31D and reference potential 7 are connected to the end of output-side coil 22H on the right side in the drawing, and the cathode of rectifier element 31B and reference potential 7 are connected to the end of output-side coil 22D on the right side in the drawing.

Referring to FIG. 12, the operation in the first state in which switching elements 11A and 11D (see FIG. 1) are turned on, that is, the directions of magnetic fluxes in cores 23A and 23B and the directions of electric currents in input-side coil 21 and output-side coil 22 are basically similar to those in FIG. 4. Referring to FIG. 13, the operation in the second state in which switching elements 11B and 11C (see FIG. 1) are turned on, that is, the directions of magnetic fluxes in cores 23A and 23B and the directions of electric currents in input-side coil 21 and output-side coil 22 are basically similar to those in FIG. 5.

That is, also in the present embodiment, electric current flows alternately only in either the first or second series coils and either the third or fourth series coils (here, electric currents flow simultaneously in the first and fourth series coils). Also in the present embodiment, the directions of electric currents flowing simultaneously in the first and fourth series coils are opposite to each other, and the directions of electric currents flowing in the second and third series coils are opposite to each other.

Since the remaining configuration in the first example of the present embodiment is almost the same as that of the first example of the first embodiment, the same reference characters are allotted to the same elements, and description thereof will not be repeated.

Figure 14:
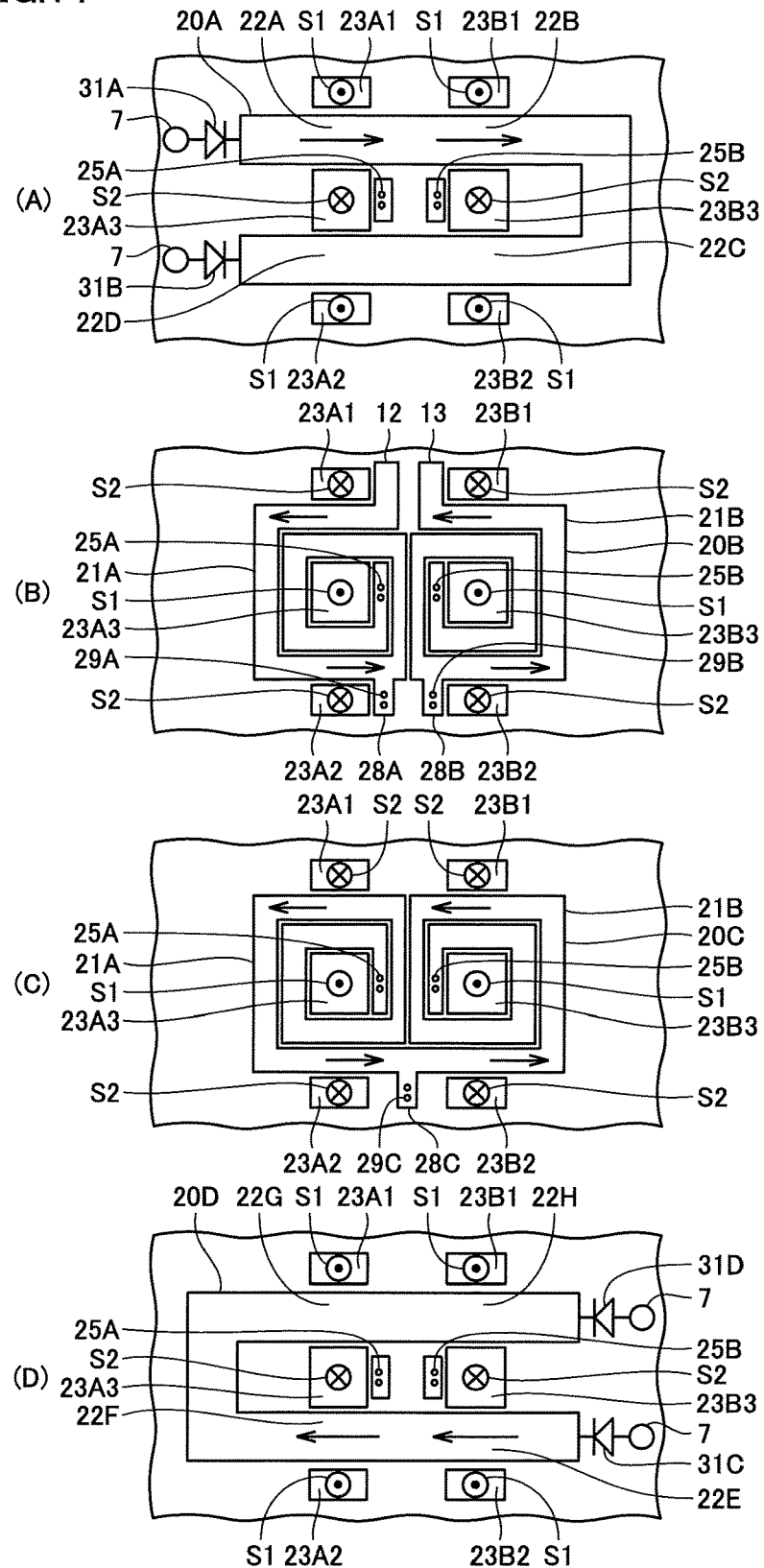
Figure 15:
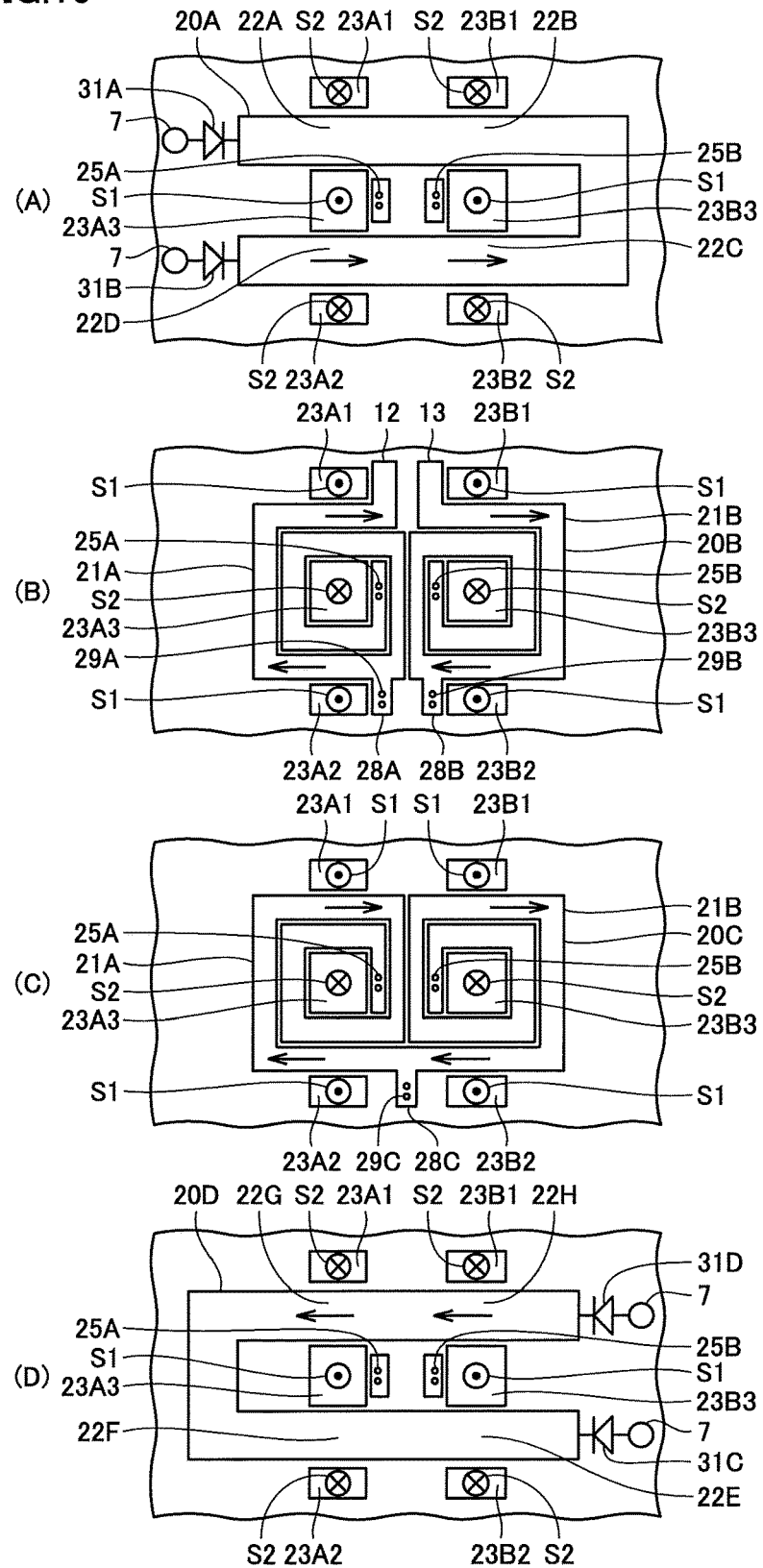

Next, referring to FIG. 14 (A) to (D) and FIG. 15 (A) to (D), in a second example of the present embodiment, the same reference characters are allotted to parts similar in configuration to the first example shown in FIGS. 12 and 13, and description thereof will not be repeated. In the second example of the present embodiment shown in FIG. 14 (A) to (D), output-side coil 22A (first output-side coil), output-side coil 22B (fifth output-side coil), output-side coil 22G (second output-side coil) and output-side coil 22H (sixth output-side coil) are arranged in similar positions to the above-described first example. FIGS. 14 (B) and (C) is basically similar to FIGS. 12 (B) and (C).

In FIG. 14 (A), however, the series connection of output-side coil 22C (seventh output-side coil) and output-side coil 22D (third output-side coil) is arranged as the same layer as pattern 20A. In FIG. 6 (D), the series connection of output-side coil 22E (eighth output-side coil) and output-side coil 22F (fourth output-side coil) is arranged as the same layer as pattern 20D.

The right end of output-side coil 22B and the right end of output-side coil 22C in FIG. 14 (A) are connected to each other by a coupling part (such as the same copper thin film pattern as output-side coil 22). The left end of output-side coil 22A is connected in series with the cathode of rectifier element 31A (first rectifier element) and reference potential 7. The left end of output-side coil 22D is connected in series with the cathode of rectifier element 31B (third rectifier element) and reference potential 7. Output-side coils 22A, 22B, 22C, and 22D are thereby formed as an integral pattern.

Similarly, the left end of output-side coil 22G and the left end of output-side coil 22F in FIG. 14 (D) are connected to each other by a coupling part (such as the same copper thin film pattern as output-side coil 22). The right end of output-side coil 22H is connected in series with the cathode of rectifier element 31D (second rectifier element) and reference potential 7. The right end of output-side coil 22E is connected in series with the cathode of rectifier element 31C (fourth rectifier element) and reference potential 7. Output-side coils 22E, 22F, 22G, and 22H are thereby formed as an integral pattern. FIG. 14 differs from FIG. 12 in the above points.

The directions of magnetic fluxes in cores 23A and 23B, the directions of electric currents in input-side coil 21 and output-side coil 22 and the like in the first and second states shown in FIGS. 14 and 15 are basically the same as those in FIGS. 6 and 7, respectively. In other words, FIG. 14 is the same as FIG. 12, and FIG. 15 is the same as FIG. 13. Thus, detailed description is omitted.

Next, the operation effects of the present embodiment will be described.

The present embodiment having the above-described configuration basically produces similar operation effects to those of the first embodiment. That is, also in the present embodiment, even if coupling unbalance occurs between the two step-down transformers resulting in different voltage values between the output-side coils of the two transformers, the electric current values of two smoothing coils 42A and 42B can be made equal. Thus, it is not necessary to leave a margin of smoothing coils 42A and 42B due to electric current unbalance between two smoothing coils 42A and 42B, thereby reducing the size of smoothing coils 42A and 42B. The remaining operation effects of the present embodiment are basically similar to those of the first embodiment.

Third Embodiment

A third embodiment differs from the first embodiment in the following points. Here, the differences of the third embodiment from the first embodiment will be described using FIG. 16 showing a circuit configuration of the present embodiment and FIGS. 17 to 18 showing a mode of the coils of each layer in a first example of the present embodiment.

Figure 16:
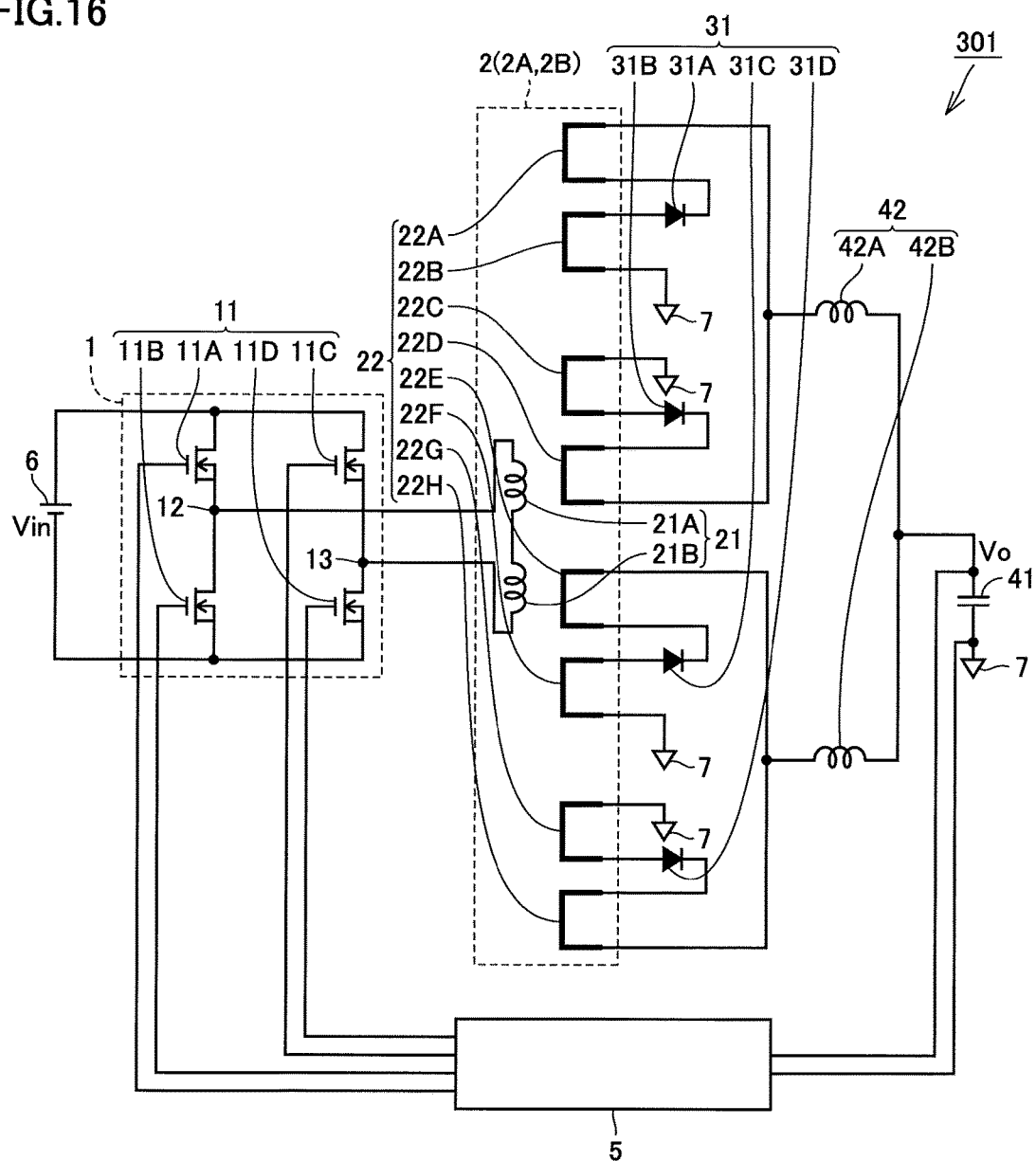
FIG. 16 is a circuit block diagram of an insulation type step-down converter of a third embodiment.
Figure 17:
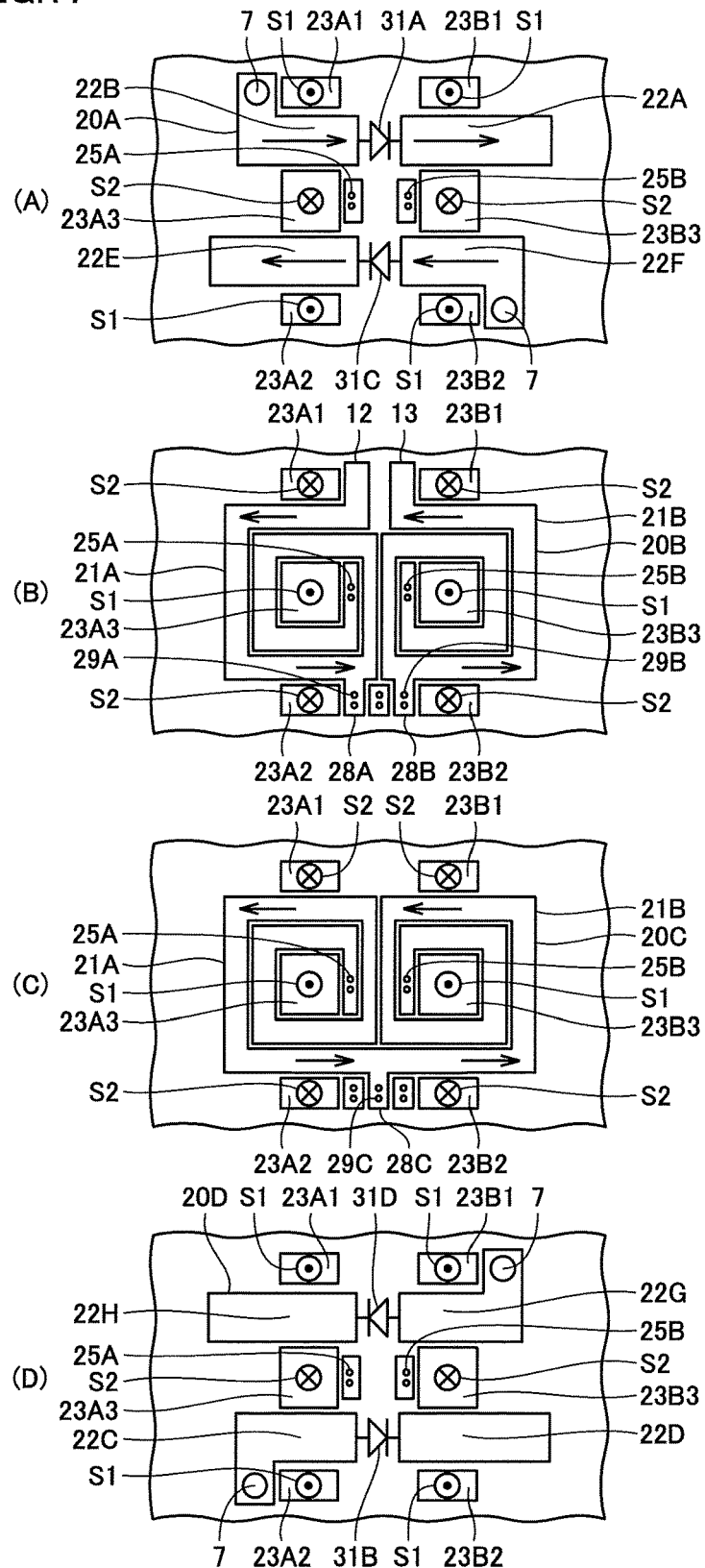
Figure 18:
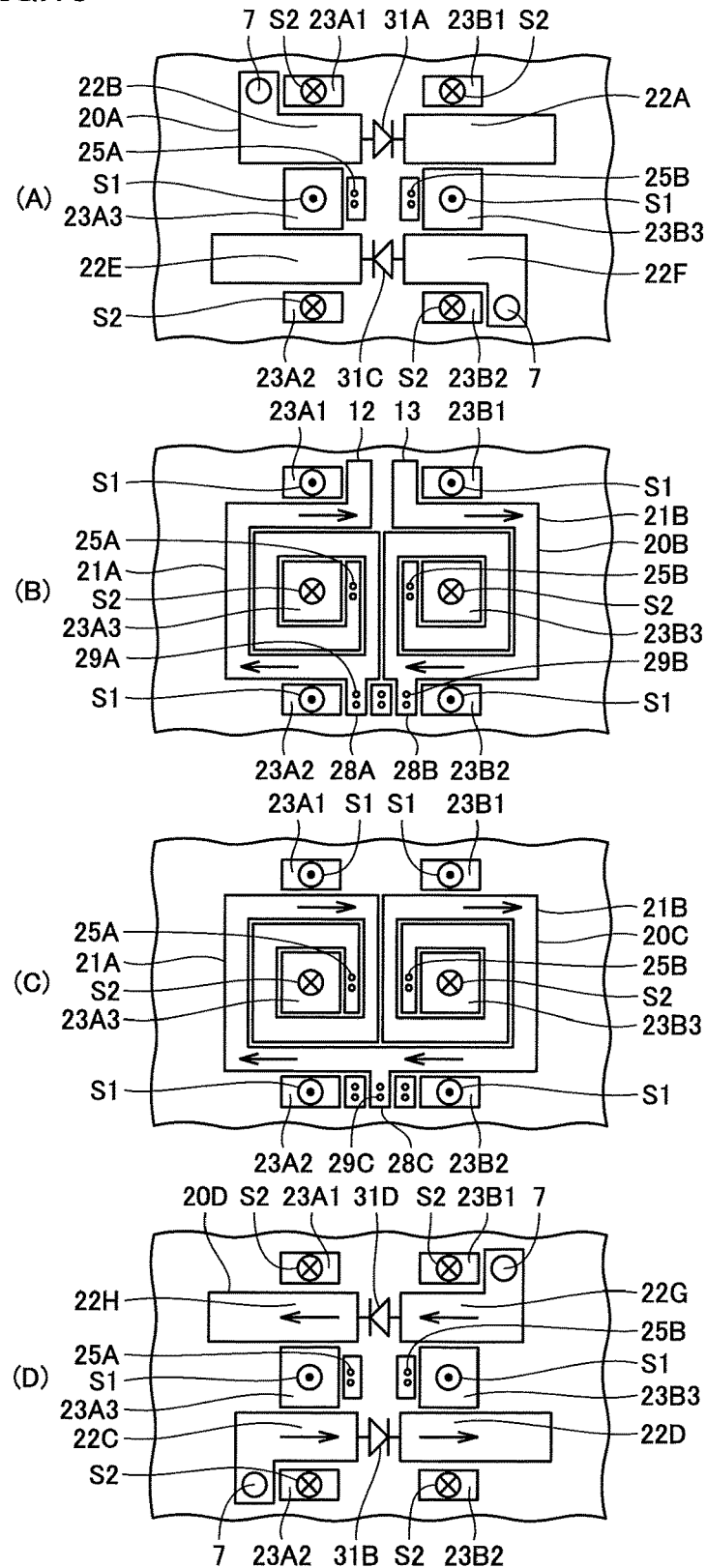

Referring to FIGS. 16 to 18, an insulation type step-down converter 301 in the first example of the present embodiment basically has a similar configuration to insulation type step-down converter 101 of the first embodiment. However, in insulation type step-down converter 301, rectifier element 31A is connected between output-side coils 22A and 22B connected in series, and reference potential 7 is connected to one end (end on the side of output-side coil 22B) of a pair of ends of output-side coils 22A and 22B connected in series. In this regard, the present embodiment (FIG. 16) differs from the configuration of the first embodiment (FIG. 1) in which one end (end on the side of output-side coil 22B) of the pair of ends of output-side coils 22A and 22B connected in series is connected to reference potential 7, and the other end (end on the side of output-side coil 22A) is connected to the anode of rectifier element 31A.

Specifically, referring to FIG. 17 (A), for example, the anode of rectifier element 31A (first rectifier element) is connected to output-side coil 22B (first output-side coil), and the cathode of rectifier element 31A is connected to output-side coil 22A (fifth output-side coil). Even in such a case where rectifier element 31A is connected between two output-side coils 22A and 22B (similarly to two output-side coils 22A and 22B connected in series so as to be aligned with each other), output-side coils 22A and 22B are connected in series to constitute the first series coils here. Rectifier element 31A may be connected to the outside of two output-side coils 22A and 22B connected in series (to one end of the first series coils formed of output-side coils 22A and 22B) as in the first embodiment, but may be connected between two output-side coils 22A and 22B connected in series as in the present embodiment. Here, even in such a case as the present embodiment, rectifier element 31A is connected in series with output-side coils 22A and 22B.

Also similarly, in FIGS. 16 to 18, rectifier element 31C (fourth rectifier element) is connected between output-side coil 22E (fourth output-side coil) and output-side coil 22F (eighth output-side coil) connected in series, and reference potential 7 is connected to one end (end on the side of output-side coil 22F) of a pair of ends of output-side coils 22E and 22F connected in series. The anode of rectifier element 31C is connected to output-side coil 22F, and the cathode of rectifier element 31C is connected to output-side coil 22E. FIGS. 17 (B) and (C) is basically similar to FIGS. 4 (B) and (C).

Referring to FIG. 17 (D), for example, rectifier element 31D (second rectifier element) is connected between output-side coil 22G (sixth output-side coil) and output-side coil 22H (second output-side coil) connected in series, and reference potential 7 is connected to one end (end on the side of output-side coil 22G) of a pair of ends of output-side coils 22G and 22H connected in series. The anode of rectifier element 31D is connected to output-side coil 22G, and the cathode of rectifier element 31D is connected to output-side coil 22H. Rectifier element 31B (third rectifier element) is connected between output-side coil 22C (third output-side coil) and output-side coil 22D (seventh output-side coil) connected in series, and reference potential 7 is connected to one end (end on the side of output-side coil 22C) of a pair of ends of output-side coils 22C and 22D connected in series. The anode of rectifier element 31B is connected to output-side coil 22C, and the cathode of rectifier element 31B is connected to output-side coil 22D.

It is noted that one end of first series coils 22A, 22B and the like connected in series is connected to reference potential 7, and the other end is connected to smoothing coil 42A and the like.

The directions of magnetic fluxes and electric currents in the above-described first state shown in FIG. 17 (in which switching elements 11A and 11D are turned on) are basically similar to those in FIG. 4, and the directions of magnetic fluxes and electric currents in the above-described second state shown in FIG. 18 (in which switching elements 11B and 11D are turned on) are basically similar to those in FIG. 5. Thus, detailed description is omitted.

Since the remaining configuration in the first example of the present embodiment is almost the same as that of the first example of the first embodiment, the same reference characters are allotted to the same elements, and description thereof will not be repeated.

Figure 19:
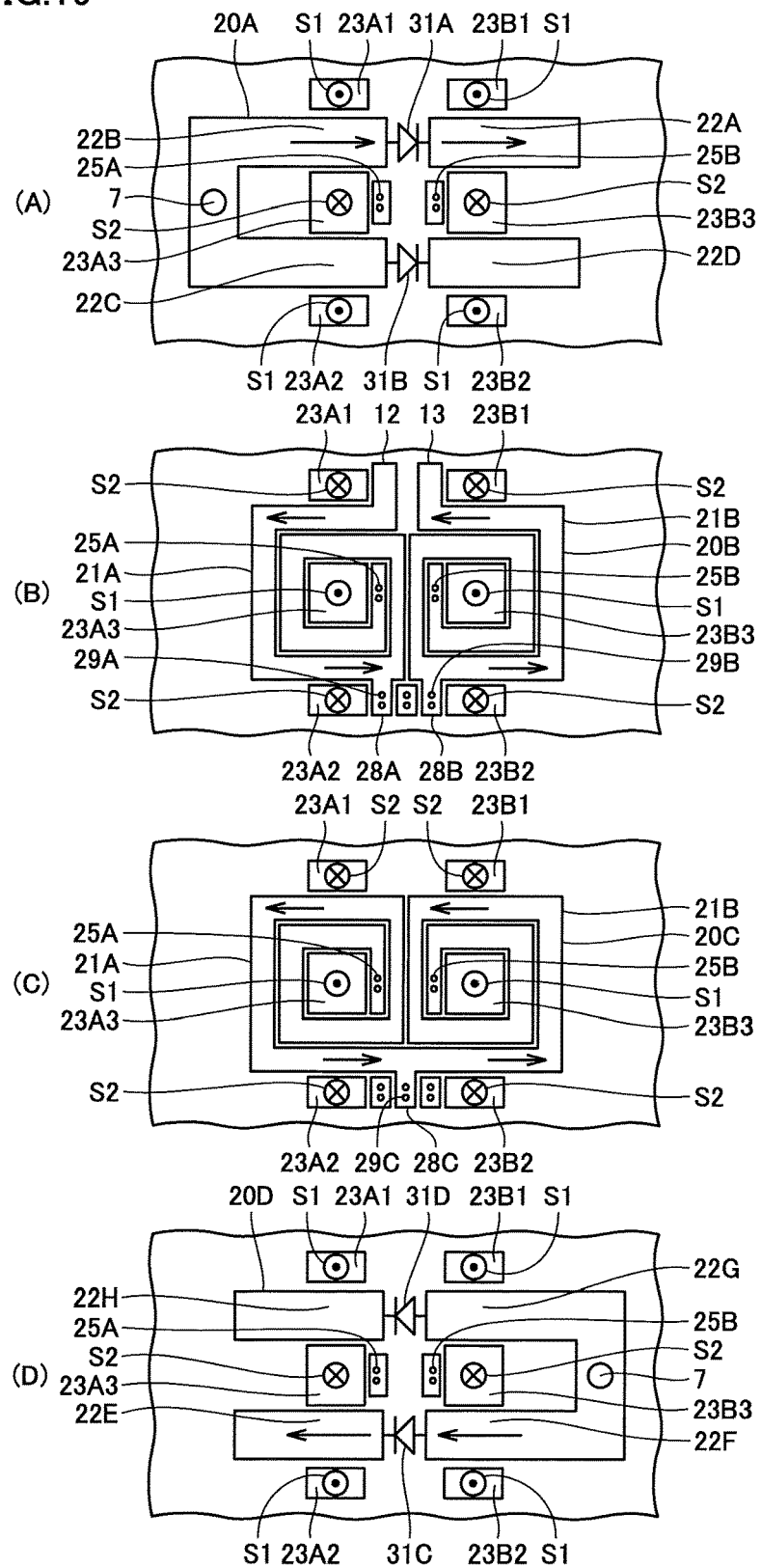
Figure 20:
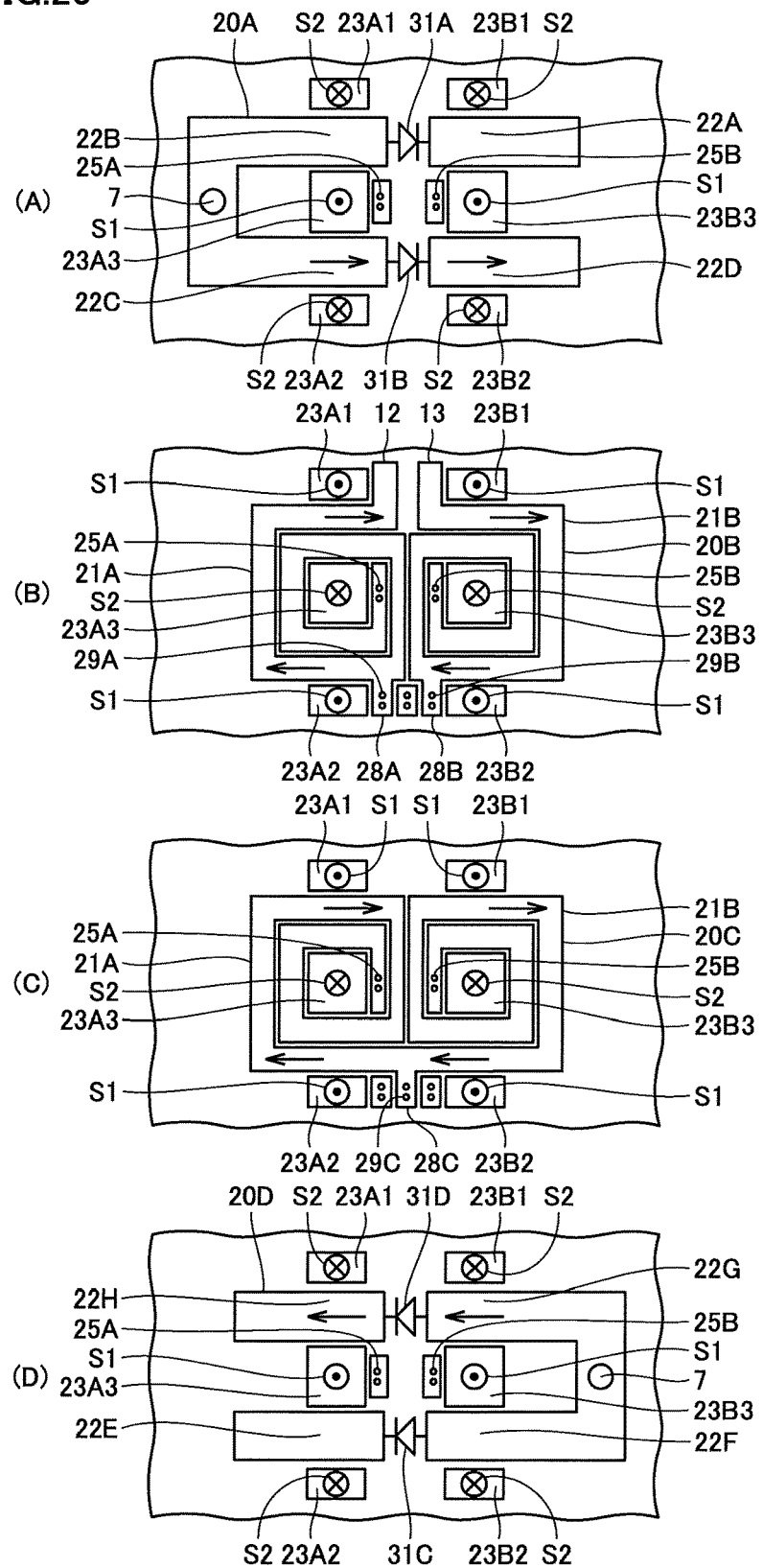

Next, referring to FIG. 19 (A) to (D) and FIG. 20 (A) to (D), in a second example of the present embodiment, the same reference characters are allotted to parts similar in configuration to the first example shown in FIGS. 17 and 18, and description thereof will not be repeated. In the second example of the present embodiment shown in FIG. 19 (A) to (D), output-side coil 22A (fifth output-side coil), output-side coil 22B (first output-side coil), output-side coil 22G (sixth output-side coil) and output-side coil 22H (second output-side coil) are arranged in similar positions to the above-described first example. FIGS. 19 (B) and (C) is basically similar to FIGS. 17 (B) and (C).

In FIG. 19 (A), however, the series connection of output-side coil 22C (third output-side coil) and output-side coil 22D (seventh output-side coil) is arranged as the same layer as pattern 20A. In FIG. 19 (D), the series connection of output-side coil 22E (fourth output-side coil) and output-side coil 22F (eighth output-side coil) is arranged as the same layer as pattern 20D.

The left end of output-side coil 22B and the left end of output-side coil 22C in FIG. 19 (A) are connected to each other by a coupling part (such as the same copper thin film pattern as output-side coil 22), and reference potential 7 is connected to this coupling part.

Similarly, the right end of output-side coil 22G and the right end of output-side coil 22F in FIG. 19 (D) are connected to each other by a coupling part (such as the same copper thin film pattern as output-side coil 22), and reference potential 7 is connected to this coupling part. FIG. 19 differs from FIG. 17 in the above points.

The directions of magnetic fluxes in cores 23A and 23B, the directions of electric currents in input-side coil 21 and output-side coil 22 and the like in the first and second states in FIGS. 19 and 20 are basically the same as those in FIGS. 6 and 7, respectively. In other words, FIG. 19 is the same as FIG. 17, and FIG. 20 is the same as FIG. 18. Thus, detailed description is omitted.

Since the operation effects of the present embodiment are basically similar to those of the first and second embodiments, detailed description is omitted.

Fourth Embodiment

A fourth embodiment differs from the second embodiment in the following points. First, the structure of each component constituting step-down transformer 2 in the present embodiment will be described using FIGS. 21 to 24. It is noted that the circuit configuration of the present embodiment is similar to that of insulation type step-down converter 201 in the second embodiment shown in FIG. 11.

Figure 23:
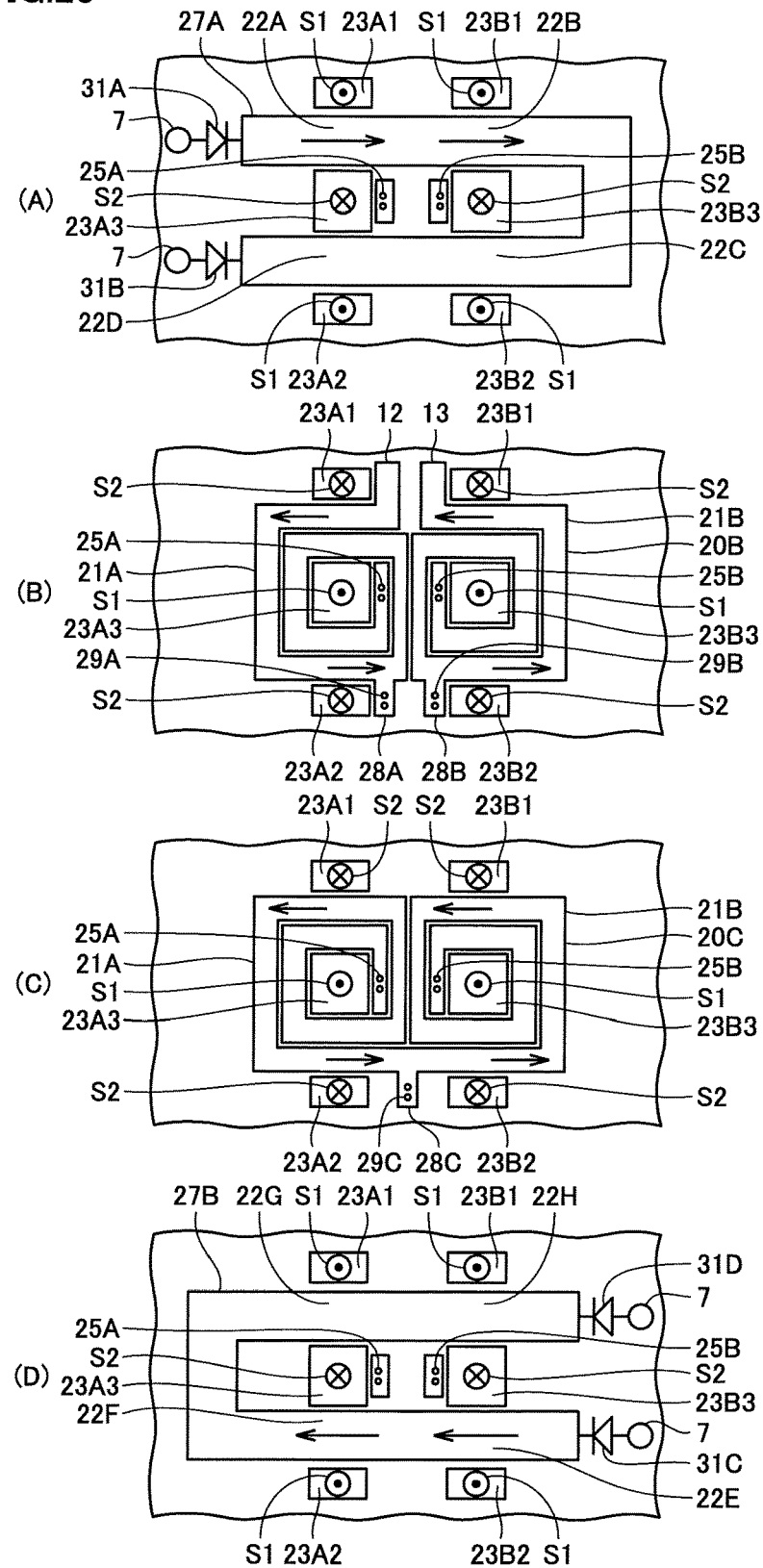
Figure 24:
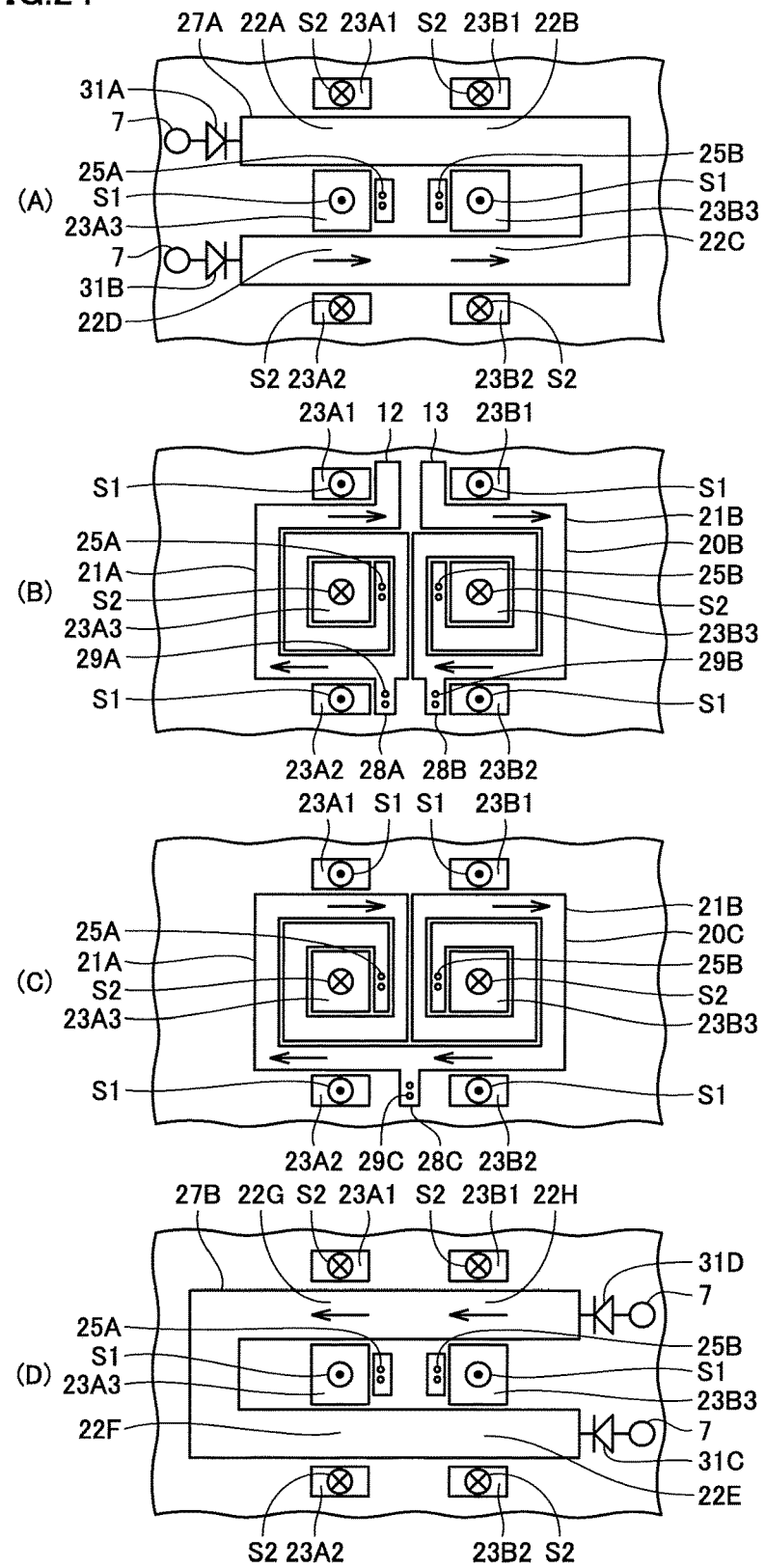

Referring to FIGS. 23 and 24, the plane shape of the pattern of coils 21 and 22 of each layer and the mode of connection of potential 7 and rectifier elements 31A to 31D in the present embodiment are basically similar to the pattern of coils 21 and 22 of each layer of multilayer printed board 26 in the second example of the second embodiment shown in FIGS. 14 and 15. Thus, detailed description of each part is omitted.

Referring to FIGS. 21 to 24, however, in the present embodiment, a metal plate 27A and a metal plate 27B (collectively called a metal plate 27), each as a flat plate component made of copper, for example, are arranged as output-side coils 22 of the first layer as the lowermost layer and the fourth layer as the uppermost layer in the coils formed in four-layer multilayer printed board 26. That is, output-side coils 22A, 22B, 22C, and 22D of the first layer are formed of metal plate 27A such as a copper plate, and output-side coils 22E, 22F, 22G, and 22H of the fourth layer are formed of metal plate 27B such as a copper plate. It is noted that aluminum or the like may be used instead of copper as metal plates 27A and 27B. In this regard, the present embodiment differs from the second embodiment in which the first layer as the lowermost layer and the fourth layer as the uppermost layer as described above are formed by copper thin film patterns 20A and 20D.

Referring to FIG. 23 (B), (C) and FIG. 24 (B), (C), however, also in the present embodiment, metallic (copper) thin film patterns similar to those in the first to third embodiments are formed as pattern 20B of the second lowermost layer and pattern 20C of the third lowermost layer in the coils formed in four-layer multilayer printed board 26.

Figure 22:
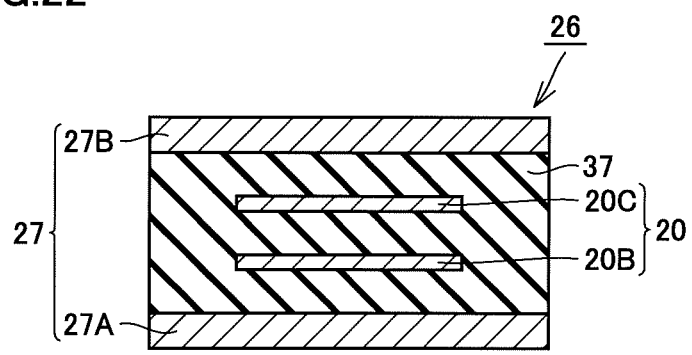
FIG. 22 is a schematic sectional view showing the configuration of the multilayer printed board at a portion taken along the line XXII-XXII in FIG. 21, after final assembly.

Referring to FIG. 22, metal plates 27A and 27B are formed to come into contact with the lowermost surface and uppermost surface of substrate body 37, respectively, similarly to patterns 20A and 20D in FIG. 3.

Referring to FIG. 22, metal plates 27A and 27B are formed thicker than patterns 20B and 20C. Metal plates 27A and 27B may be formed to have a width longer than the width of multilayer printed board 26 in the depth direction in FIG. 21, that is, to protrude from the both ends of multilayer printed board 26 in the depth direction in FIG. 21. It is noted that, as shown in FIG. 22, metal plates 27A and 27B and patterns 20B and 20C are spaced from each other by substrate body 37 of an insulating material (so as not to be short-circuited to each other), similarly to the first embodiment.

The directions of magnetic fluxes and electric currents in the above-described first state shown in FIG. 23 (in which switching elements 11A and 11D are turned on) are basically similar to those in FIG. 4, and the directions of magnetic fluxes and electric currents in the above-described second state shown in FIG. 24 (in which switching elements 11B and 11D are turned on) are basically similar to those in FIG. 5. Thus, detailed description is omitted.

Radiation patterns 28A to 28C shown in FIG. 23 (A) to (D) and FIG. 24 (A) to (D) are formed as copper thin film patterns similarly to the other embodiments. However, at least in the layers on which metal plates 27A and 27B are formed as shown in FIGS. 23 (A) and (D), a copper thin film pattern is not formed in regions overlapping the regions in which metal plates 27A and 27B are formed.

Since the remaining configuration of the present embodiment is almost the same as that of the second example of the second embodiment, the same reference characters are allotted to the same elements, and description thereof will not be repeated.

Next, the operation effects of the present embodiment will be described. In addition to the operation effects of the first embodiment, the present embodiment can produce the following operation effects.

Since output-side coil 22 is foamed of metal plates 27A and 27B as flat plate components made of copper in the present embodiment, the thickness becomes larger than in the case in which output-side coil 22 is formed as a thin film pattern. It is therefore possible to increase the current-carrying cross section of output-side coil 22 of the present embodiment. Accordingly, even if the output current of the insulation type step-down converter increases to increase electric currents in output-side coil 22, the amount of heat generated by output-side coil 22 can be reduced in the present embodiment.

Moreover, in the present embodiment, as shown in FIG. 23 (A), (D) and the like, output-side coils 22A and 22B (first series coils) and output-side coils 22C and 22D (third series coils) are connected to each other by the coupling part. Similarly, output-side coils 22E and 22F (fourth series coils) and output-side coils 22G and 22H (second series coils) are connected to each other by the coupling part. Accordingly, manufacturing costs can be made lower than in the case in which these series coil are separate members.

Moreover, in the present embodiment, it is more preferable that two metal plates 27A and 27B have the same shape and size equal in plane shape and thickness to each other. Manufacturing costs of metal plates 27A and 27B can thereby be made lower than in the case in which metal plates 27A and 27B have different shapes and sizes.

The radiation path of the above-described step-down transformer will be described finally using FIG. 25.

Figure 21:
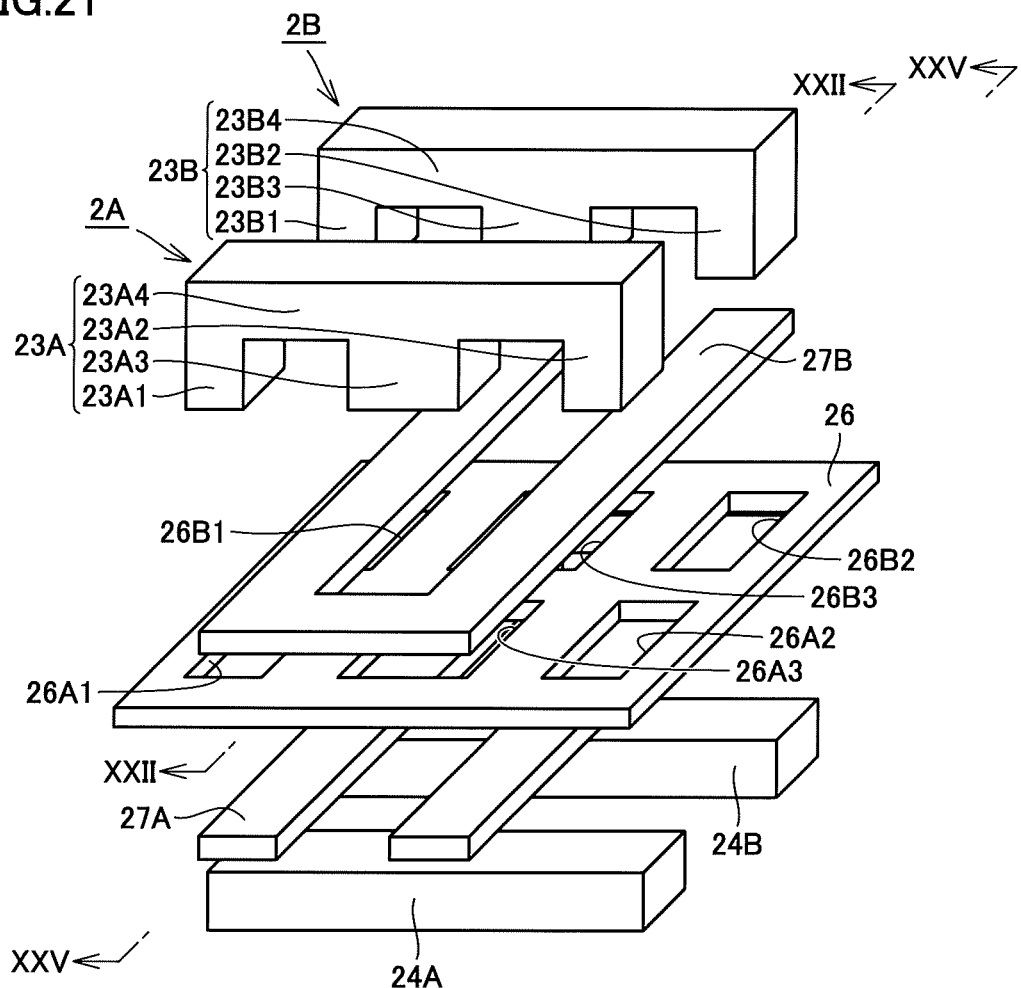
FIG. 21 is an exploded perspective view showing arrangement of cores and a multilayer printed board constituting a step-down transformer of a fourth embodiment.
Figure 25:
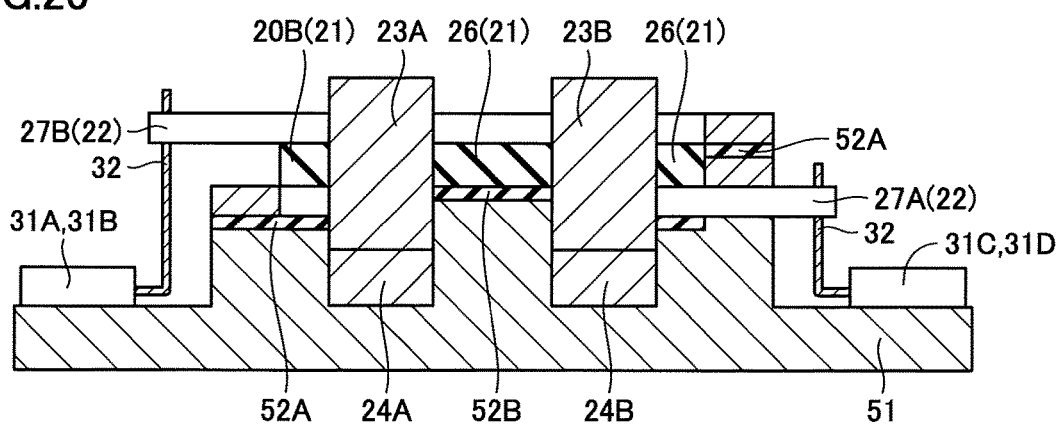
FIG. 25 is a schematic sectional view showing a mode in which a portion along the line XXV-XXV in FIG. 21 according to the fourth embodiment has been assembled and set in a radiator.

Referring to FIG. 25, the step-down transformer after assembly at a portion along the line XXV-XXV in FIG. 21 is basically similar to the configuration and operation effects of the first embodiment in FIG. 12, and thus the same reference characters are allotted to the same components as those in FIG. 12 and description thereof will not be repeated, but differs in the following points.

In FIGS. 23 and 24, reference potential 7 is connected to the anode of rectifier element 31, and is not directly connected to output-side coil 22. In FIG. 25, therefore, output-side coil 22 and radiator 51 as reference potential 7 are not fastened to each other with screws.

In FIG. 25, the ends of metal plates 27A and 27B connected to smoothing coil 42 are brought into contact with radiator 51 by interposing an insulating sheet 52A therebetween, without screws. Heat generated by output-side coil 22 is thereby transferred to radiator 51 and radiated. There is also a route along which heat passes from metal plate 27A of the first layer as the lowermost layer of the stacked layers, through an insulating sheet 52B, and is further radiated to radiator 51 in contact with the lower side of insulating sheet 52B.

Fifth Embodiment

A fifth embodiment differs from the third embodiment in the following points. First, the structure of each component constituting step-down transformer 2 in the present embodiment will be described using FIGS. 26 to 28. It is noted that the circuit configuration of the present embodiment is similar to that of insulation type step-down converter 301 in the third embodiment shown in FIG. 16.

Figure 27:
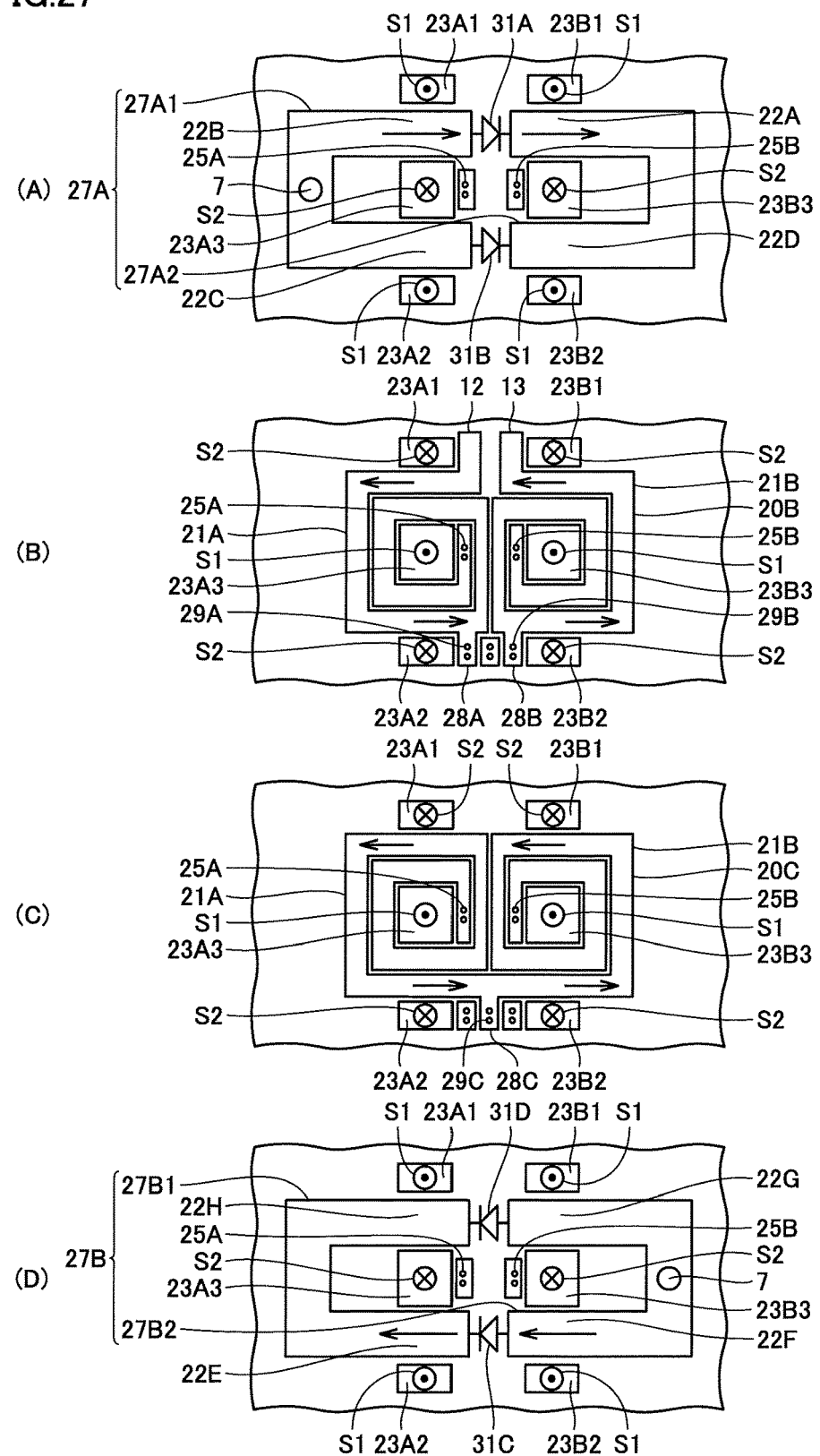
Figure 28:
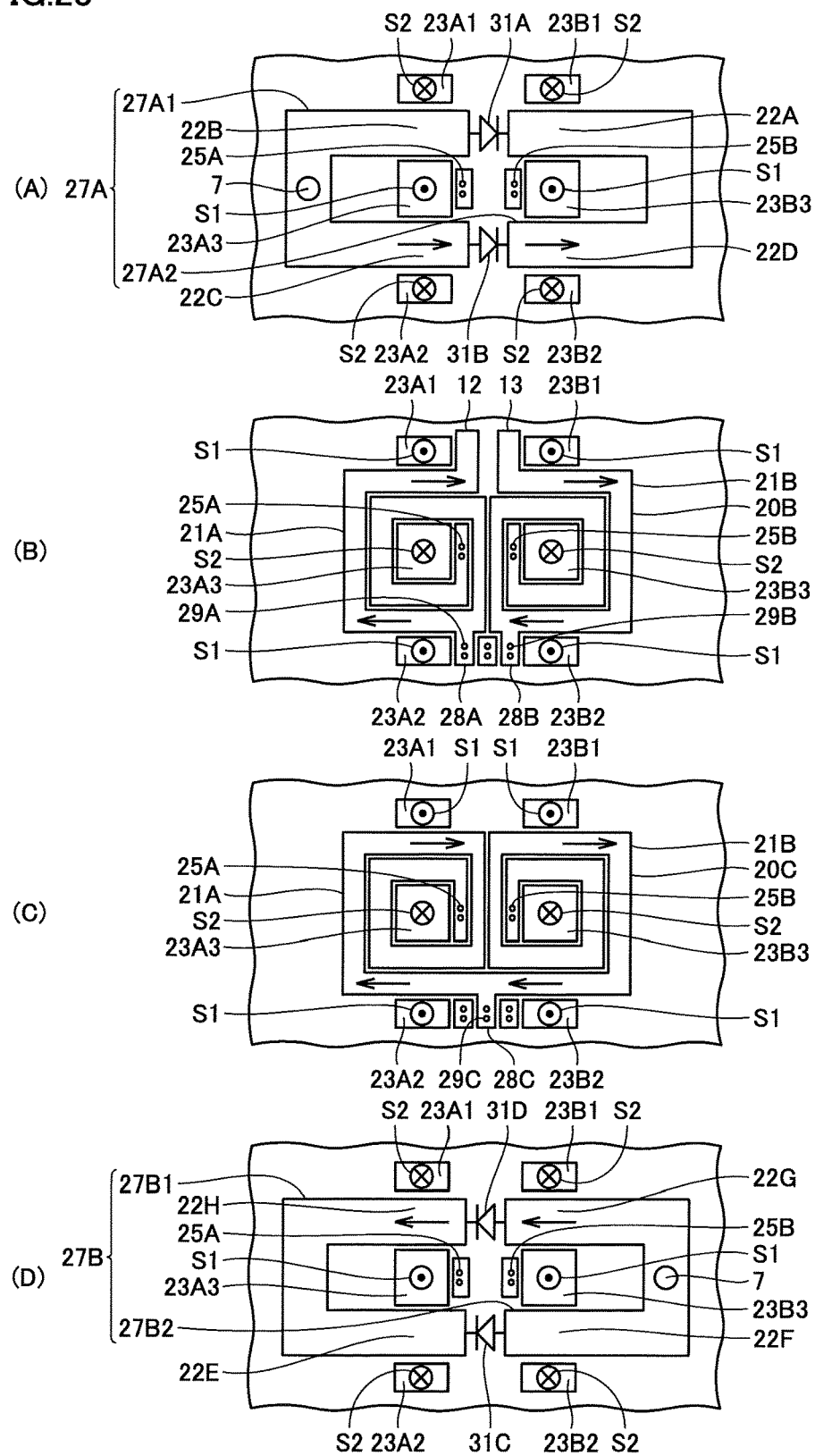

Referring to FIGS. 27 and 28, the plane shape of the pattern of coils 21 and 22 of each layer and the mode of connection of reference potential 7 and rectifier elements 31A to 31D in the present embodiment are similar to the pattern of coils 21 and 22 of each layer of multilayer printed board 26 in the second example of the third embodiment shown in FIGS. 19 and 20. Thus, detailed description of each part is omitted.

Figure 26:
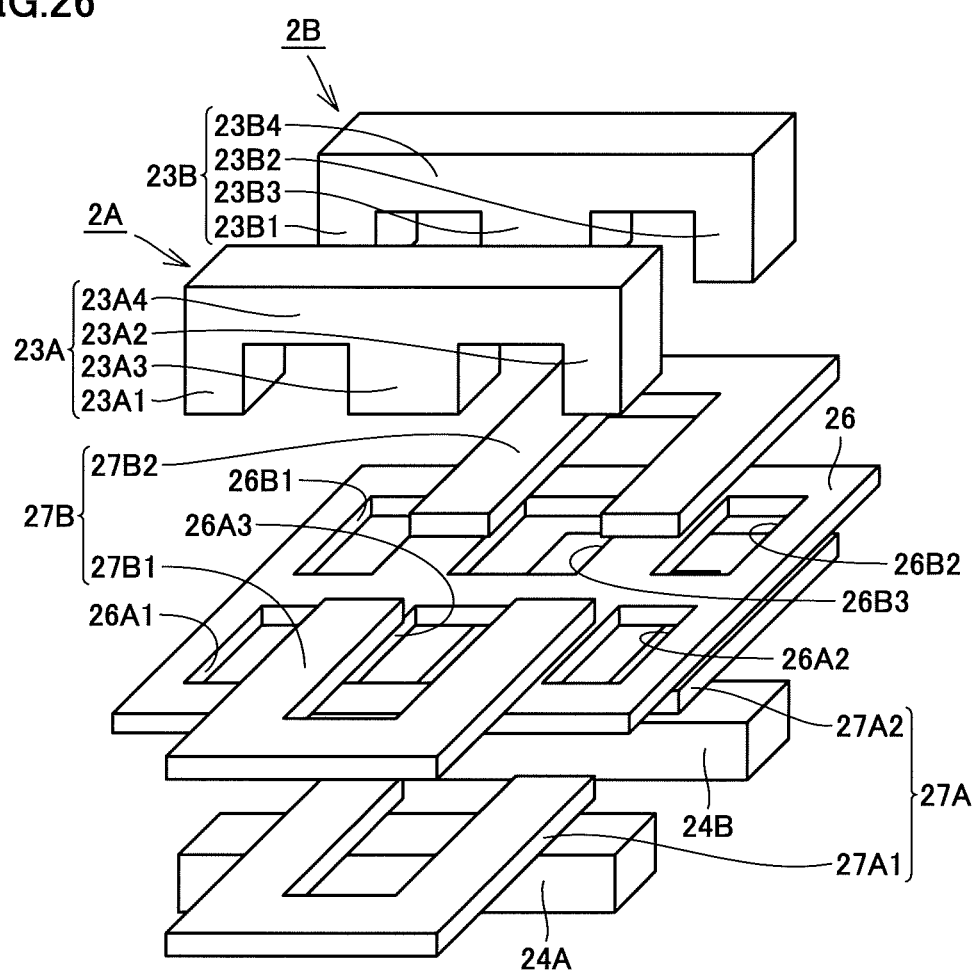
FIG. 26 is an exploded perspective view showing arrangement of cores and a multilayer printed board constituting a step-down transformer of a fifth embodiment.

Referring to FIGS. 26 to 28, however, in the present embodiment, metal plate 27A and metal plate 27B (collectively called metal plate 27), each as a flat plate component made of copper, for example, are arranged as output-side coils 22 of the first layer as the lowermost layer and the fourth layer as the uppermost layer in the coils formed in four-layer multilayer printed board 26, similarly to the fourth embodiment.

Metal plate 27A of the first layer has a metal plate 27A1 including output-side coils 22B and 22C in the left-half region in FIG. 27 (A) constituting step-down transformer 2A, and a metal plate 27A2 including output-side coils 22A and 22D in the right-half region in FIG. 27 (A) constituting step-down transformer 2B. That is, FIGS. 27 and 28 slightly differ from FIGS. 19 and 20 in plane shape in that output-side coils 22A and 22D are integrally coupled to each other by a coupling part also in metal plate 27A2 on the right side, similarly to metal plate 27A1.

Metal plate 27B of the fourth layer has a metal plate 27B1 including output-side coils 22H and 22E in the left-half region in FIG. 27 (D) constituting step-down transformer 2A, and a metal plate 27B2 including output-side coils 22G and 22F in the right-half region in FIG. 27 (D) constituting step-down transformer 2B. That is, FIGS. 27 and 28 slightly differ from FIGS. 19 and 20 in plane shape in that output-side coils 22H and 22E are integrally coupled to each other by a coupling part also in metal plate 27B1 on the left side, similarly to metal plate 27B2.

Reference potential 7 may be directly connected to the coupling part of output-side coils 22B and 22C in metal plate 27A1, and the coupling part of output-side coils 22F and 22G in metal plate 27B2. Alternatively, a mode may be brought about in which the above-described coupling parts are provided with holes extending through metal plates 27A1 and 27B2 and the holes are screwed, for example, to connect to radiator 51 as reference potential 7 on the output side.

It is noted that input-side coils 21A and 21B shown in FIG. 27 (B), (C) and the like are formed by copper thin film patterns also in the present embodiment.

The present embodiment differs in the above points from the third embodiment in which the first layer as the lowermost layer and the fourth layer as the uppermost layer described above are formed by copper thin film patterns 20A and 20D.

The directions of magnetic fluxes and electric currents in the above-described first state shown in FIG. 27 (in which switching elements 11A and 11D are turned on) are basically similar to those in FIG. 4, and the directions of magnetic fluxes and electric currents in the above-described second state shown in FIG. 28 (in which switching elements 11B and 11D are turned on) are basically similar to those in FIG. 5. Thus, detailed description is omitted.

Since the remaining configuration of the present embodiment is almost the same as those of particularly the second example of the third embodiment and the fourth embodiment, the same reference characters are allotted to the same elements, and description thereof will not be repeated.

Since the operation effects of the present embodiment are basically similar to those of the fourth embodiment, description thereof will not be repeated.

The characteristics described in (the respective examples included in) the respective embodiments described above can be combined appropriately within the range where technical inconsistency does not occur.

According to each of the embodiments described above, in each of the examples, the first series coils and the fourth series coils in which electric currents flow simultaneously are arranged on the same first layer (on the same plane), and the second series coils and the third series coils in which electric currents flow simultaneously are arranged on the same second layer (on the same plane) different from the above-described first layer, as shown in FIGS. 4 and 5, for example. However, this is not a limitation, but the first series coils and the third series coils in which electric currents flow simultaneously may be arranged on the same first layer or second layer, for example. In this case, output-side coils 22A and 22B serve as the first series coils, and output-side coils 22E and 22F serve as the third series coils, for example.

According to each of the embodiments described above, in each of the examples, the first series coils and the fourth series coils in which electric currents flow simultaneously are arranged on layers different from each other (on different planes), and the second series coils and the third series coils in which electric currents flow simultaneously are arranged on layers different from each other (on different planes), as shown in FIGS. 6 and 7, for example. However, this is not a limitation, but the first series coils and the third series coils in which electric currents flow simultaneously may be arranged on layers different from each other (on different planes) (the first series coils and the fourth series coil may be arranged on the same layer), for example. In this case, series coils 22A and 22B serve as first series coils, and series coils 22E and 22F serve as third series coils, for example.

It should be understood that the embodiments disclosed herein are illustrative and non-restrictive in every respect. The scope of the present invention is defined by the claims, not by the description above, and is intended to include any modification within the meaning and scope equivalent to the terms of the claims.

REFERENCE SIGNS LIST

1 input-side drive circuit; 2 step-down transformer; 5 control circuit; 6 DC power supply; 7 reference potential; 11, 11A, 11B, 11C, 11D switching element; 12, 13 node; 20, 20A, 20B, 20C, 20D pattern; 21, 21A, 21B input-side coil; 22, 22A, 22B, 22C, 22D, 22E, 22F, 22G, 22H output-side coil; 23A, 23B E-shaped core; 23A1, 23A2, 23B1, 23B2 outer leg; 23A3, 23B3 middle leg; 24A, 24B I-shaped core; 26 multilayer printed board; 26A1, 26A2, 26A3, 26B1, 26B2, 26B3, 54 through-hole; 27, 27A, 27A1, 27A2, 27B, 27B1, 27B2 metal plate; 28A, 28B, 28C radiation pattern; 31, 31A, 31B, 31C, 31D rectifier element; 32 wire; 37 substrate body; 41 smoothing capacitor; 42, 42A, 42B smoothing coil; 51 radiator; 52, 52A, 52B insulating sheet; 53 screw; 101, 201, 301 insulation type step-down converter.

The invention claimed is:

1. An insulation type step-down converter comprising first and second step-down transformers aligned with each other, the first step-down transformer including
a first core including a first middle leg, a first one outer leg spaced from the first middle leg and arranged to extend in a direction identical to the first middle leg, and a first other outer leg spaced from the first middle leg opposite to the first one outer leg,
a first input-side coil wound around the first middle leg of the first core,
first and second output-side coils arranged between the first one outer leg and the first middle leg, overlapping at least part of the first input-side coil and spaced from each other, and
third and fourth output-side coils arranged between the first other outer leg and the first middle leg, overlapping at least part of the first input-side coil and spaced from each other,
the second step-down transformer including
a second core including a second middle leg, a second one outer leg spaced from the second middle leg and arranged to extend in a direction identical to the second middle leg, and a second other outer leg spaced from the second middle leg opposite to the second one outer leg,
a second input-side coil wound around the second middle leg of the second core and connected in series with the first input-side coil,
fifth and sixth output-side coils arranged between the second one outer leg and the second middle leg, overlapping at least part of the second input-side coil, spaced from each other, and connected in series with the first and second output-side coils, respectively, and
seventh and eighth output-side coils arranged between the second other outer leg and the second middle leg, overlapping at least part of the second input-side coil, spaced from each other, and connected in series with the third and fourth output-side coils, respectively,
the insulation type step-down converter further comprising:
a first rectifier element connected in series with the first and fifth output-side coils;
a second rectifier element connected in series with the second and sixth output-side coils;
a third rectifier element connected in series with the third and seventh output-side coils;
a fourth rectifier element connected in series with the fourth and eighth output-side coils;
a first smoothing coil connected to first series coils in which the first and fifth output-side coils are connected in series and third series coils in which the third and seventh output-side coils are connected in series; and
a second smoothing coil connected to second series coils in which the second and sixth output-side coils are connected in series and fourth series coils in which the fourth and eighth output-side coils are connected in series, the first, second, third, and fourth rectifier elements being connected such that electric currents flow simultaneously only in one of the first and second series coils and one of the third and fourth series coils in an alternate manner, and electric currents flowing simultaneously in one of the first and second series coils and one of the third and fourth series coils are opposite in direction to each other so as to cancel out magnetic fluxes passing through the middle legs each time when electric current flowing in the first and second input-side coils is changed in direction.

2. The insulation type step-down converter according to claim 1, wherein
one of the first and second series coils and one of the third and fourth series coils, in which electric currents flow simultaneously, are arranged on a first layer identical to each other, and
the other one of the first and second series coils and the other one of the third and fourth series coils, in which electric currents flow simultaneously, are arranged on a second layer identical to each other, the second layer being different from the first layer.

3. The insulation type step-down converter according to claim 1, wherein
one of the first and second series coils and one of the third and fourth series coils, in which electric currents flow simultaneously, are arranged on layers different from each other, and
the other one of the first and second series coils and the other one of the third and fourth series coils, in which electric currents flow simultaneously, are arranged on layers different from each other.

4. The insulation type step-down converter according to claim 1, wherein
each of the first, second, third, fourth, fifth, sixth, seventh, and eighth output-side coils extends linearly in plan view.

5. The insulation type step-down converter according to claim 1, further comprising an input-side drive circuit configured to apply voltages to the first and second input-side coils alternately in directions opposite to each other at regular time intervals.

6. The insulation type step-down converter according to claim 1, further comprising:
a radiator arranged to come into contact with the first and second step-down transformers; and
an insulating component arranged between the radiator and at least one of the first and second input-side coils and at least one of the first, second, third, fourth, fifth, sixth, seventh, and eighth output-side coils, wherein
heat generated by at least one of the first and second input-side coils and at least one of the first, second, third, fourth, fifth, sixth, seventh, and eighth output-side coils is transferred to the radiator through the insulating component.

7. The insulation type step-down converter according to claim 6, wherein
at least one of the first, second, third, fourth, fifth, sixth, seventh, and eighth output-side coils is arranged between the radiator and at least one of the first and second input-side coils, and
the radiator is arranged as a reference potential of an output-side drive circuit including the first, second, third, fourth, fifth, sixth, seventh, and eighth output-side coils of the first and second step-down transformers.

8. The insulation type step-down converter according to claim 6, comprising a radiation pattern and a radiation via connected to the first and second input-side coils and transferring heat generated by the first and second input-side coils to the insulating component.

9. The insulation type step-down converter according to claim 1, wherein
each of the first, second, third, fourth, fifth, sixth, seventh, and eighth output-side coils is formed as a flat plate component made of copper.

* * * * *